United States Patent
Chen et al.

(10) Patent No.: US 11,056,375 B2
(45) Date of Patent: Jul. 6, 2021

(54) MICRO LED CARRIER BOARD

(71) Applicant: PlayNitride Display Co., Ltd., Zhunan Township (TW)

(72) Inventors: Pei-Hsin Chen, Zhunan Township (TW); Yi-Ching Chen, Zhunan Township (TW); Yu-Chu Li, Zhunan Township (TW); Yi-Chun Shih, Zhunan Township (TW); Ying-Tsang Liu, Zhunan Township (TW); Yu-Hung Lai, Zhunan Township (TW); Tzu-Yang Lin, Zhunan Township (TW)

(73) Assignee: PLAYNITRIDE DISPLAY CO., LTD., Zhunan Township (TW)

( * ) Notice: Subject to any disclaimer, the term of this patent is extended or adjusted under 35 U.S.C. 154(b) by 0 days.

(21) Appl. No.: 16/720,854

(22) Filed: Dec. 19, 2019

(65) Prior Publication Data
US 2020/0273737 A1    Aug. 27, 2020

(30) Foreign Application Priority Data
Feb. 27, 2019    (TW) .................................. 108106698

(51) Int. Cl.
*H01L 21/683* (2006.01)
*H01L 21/67* (2006.01)
(Continued)

(52) U.S. Cl.
CPC .... *H01L 21/6835* (2013.01); *H01L 21/67144* (2013.01); *H01L 25/0753* (2013.01);
(Continued)

(58) Field of Classification Search
CPC .......... H01L 21/6835; H01L 21/67144; H01L 25/0753; H01L 2933/0066;
(Continued)

(56) References Cited

U.S. PATENT DOCUMENTS

| | | | | |
|---|---|---|---|---|
| 6,080,650 A | * | 6/2000 | Edwards | ............. H01L 21/6835 257/E21.508 |
| 7,563,625 B2 | * | 7/2009 | Tran | ........................ H01L 33/22 257/E21.216 |

(Continued)

FOREIGN PATENT DOCUMENTS

| | | |
|---|---|---|
| TW | M374153 U1 | 2/2010 |
| TW | 201709559 A | 3/2017 |

OTHER PUBLICATIONS

Office Action Taiwanese Application No. 108106698, dated Aug. 13, 2019.

*Primary Examiner* — Vu A Vu
(74) *Attorney, Agent, or Firm* — Birch, Stewart, Kolasch & Birch, LLP

(57) ABSTRACT

A micro LED carrier board is provided. The micro LED carrier board includes a substrate structure having a first surface and a second surface and having a central region and a peripheral region on the outside of the central region. The micro LED carrier board includes a plurality of micro LED elements forming an array and on the second surface of the substrate structure. The micro LED carrier board includes a patterned structure formed on the first surface and the second surface. The patterned structure has a first pattern density in the central region and a second pattern density in the peripheral region, and the first pattern density is different from the second pattern density.

17 Claims, 14 Drawing Sheets

(51) Int. Cl.
    *H01L 25/075* (2006.01)
    *H01L 33/62* (2010.01)
(52) U.S. Cl.
    CPC .... *H01L 33/62* (2013.01); *H01L 2221/68363* (2013.01); *H01L 2933/0066* (2013.01)
(58) Field of Classification Search
    CPC ........... H01L 2221/68363; H01L 33/62; H01L 2221/68354; H01L 2221/68318; H01L 2221/68381
    USPC ......................................................... 257/88
    See application file for complete search history.

(56) References Cited

U.S. PATENT DOCUMENTS

| | | | |
|---|---|---|---|
| 9,450,147 B2* | 9/2016 | McGroddy | H01L 27/016 |
| 2006/0094246 A1* | 5/2006 | Whitefield | G03F 7/2028 |
| | | | 438/725 |
| 2014/0103367 A1* | 4/2014 | Lin | H01L 27/15 |
| | | | 257/88 |

* cited by examiner

110

MICRO LED CARRIER BOARD

CROSS REFERENCE TO RELATED APPLICATIONS

This Application claims priority of Taiwan Patent Application No. 108106698, filed on Feb. 27, 2019, the entirety of which is incorporated by reference herein.

BACKGROUND

Field of the Disclosure

The present disclosure relates to a semiconductor structure, and in particular it relates to a micro LED carrier board.

Description of the Related Art

With the advancements being made in the field of optoelectronic technology, the size of optoelectronic components has gradually evolved toward miniaturization. In recent years, due to breakthroughs in the size of light-emitting diodes (LEDs), micro light-emitting diode (micro LED) displays in which micro light-emitting diodes are arranged in an array have increasingly interested people in the field. A micro LED display is a self-luminous display, and it is more energy efficient than organic light-emitting diodes (OLEDs) displays. Furthermore, a micro LED display has better contrast performance than an OLED display, and it is visible under in sunlight. In addition, since micro LED displays use inorganic material, they have better reliability and a longer lifetime than OLED displays.

However, micro LEDs still have some disadvantages. For example, when a mass transfer process is performed for micro LED display manufacture, part of the micro light-emitting diode elements may be damaged or destroyed. As a result, the reliability, yield and durability of the micro LED display are reduced. Therefore, how to reduce or avoid damage to the micro light-emitting diode element in the process of transferring it to the receiving substrate has become a topic of great concern in the industry.

BRIEF SUMMARY

Some embodiments of the disclosure provide a micro light-emitting diode carrier board. The micro light-emitting diode carrier board includes a substrate structure having a first surface and a second surface and having a central region and a peripheral region located outside the central region. The micro light-emitting diode carrier board also includes a plurality of micro light-emitting diode elements forming an array and located on the second surface of the substrate structure. The micro light-emitting diode carrier board also includes a patterned structure formed on the first surface or the second surface. The patterned structure has a first pattern density in the central region and has a second pattern density in the peripheral region, and the first pattern density is different from the second pattern density.

Other embodiments of the disclosure provide a micro light-emitting diode carrier board. The micro light-emitting diode carrier board includes a plurality of micro light-emitting diode elements and a substrate structure having a central region and a peripheral region. The substrate structure includes a substrate having an upper surface and a lower surface; and a bonding layer formed on the lower surface. The bonding layer has a first thickness in the central region and has a second thickness in the peripheral region. The first thickness is greater than the second thickness. The micro light-emitting diode elements are disposed on the bonding layer and form an array.

BRIEF DESCRIPTION OF THE DRAWINGS

A detailed description is given in the following embodiments with reference to the accompanying drawings. It should be emphasized that many features are not drawn to scale according to standard practice in the industry. In fact, the dimensions of the various components may be arbitrarily increased or decreased for clarity of discussion.

DETAILED DESCRIPTION

It should be understood that the following disclosure provides many different embodiments or examples, for implementing different features of the embodiments of the present invention. Specific embodiments or examples of components and arrangements are described below to simplify the present disclosure. Of course, these are merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. Furthermore, in the embodiments of the present invention, some element symbols and/or letters may be repeated in many examples. These repetitions are for the purpose of simplification and clarity and are not intended to represent a particular relationship between the various embodiments and/or configurations discussed.

In the present specification, the term "about" or "approximately" means in a range of 20% of a given value or range, preferably 10%, and more preferably 5%. In the present specification, if there is no specific explanation, a given value or range means an approximate value which may imply the meaning of "about" or "approximately".

A micro light-emitting diode (micro LED) carrier structure is provided in some embodiments of the present invention. More specifically, in some embodiments of the present invention, the warpage or bending of the substrate structure can be suppressed by the micro light-emitting diode carrier board having a specific patterned structure, or it is possible to reduce or avoid damage to the micro light-emitting diode elements in the process of transferring to the receiving substrate. As a result, the reliability, yield, and durability of the micro light-emitting diode structure can be significantly improved.

The term "micro" LED element as used in this specification refers to a light-emitting diode element having a length, a width, and a height in the range of 1 μm to 100 μm. According to some embodiments of the present invention, the micro light-emitting diode element may have a maximum width of 20 μm, 10 μm or 5 μm. According to some embodiments of the present invention, the maximum height of the micro light-emitting diode element may be 20 μm, 10 μm or 5 μm. However, it should be understood that embodiments of the present invention are not limited thereto, and aspects of certain embodiments may be applied to dimensions that may be larger or smaller.

Figure 1A:
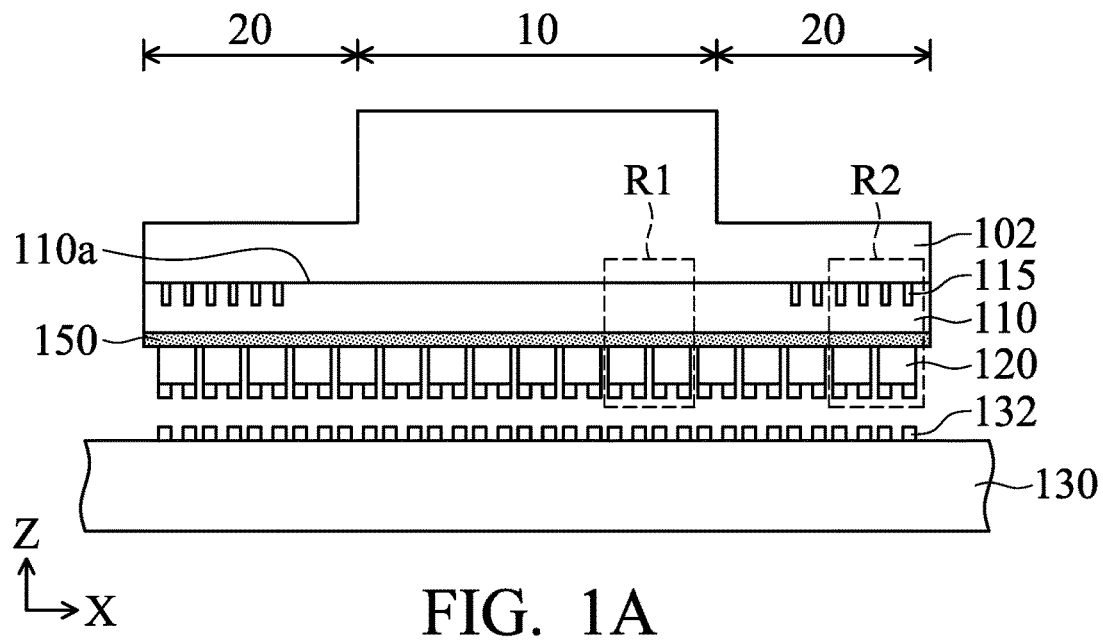
FIG. 1A is a cross-sectional view corresponding to a transferring process of the micro light-emitting diode elements, in accordance with some embodiments of the disclosure.

FIG. 1A is a cross-sectional view corresponding to a transferring process of the micro light-emitting diode elements, in accordance with some embodiments of the disclosure. Referring to FIG. 1A, the transferring process of the micro light-emitting diode elements may include moving the micro light-emitting diode carrier board over the receiving substrate 130 by a transfer holder 102 and transferring the micro light-emitting diode elements 120 from the micro light-emitting diode carrier board to the receiving substrate 130.

The transfer holder 102 can hold and move the micro light-emitting diode carrier board. The transfer holder 102 can hold the micro light-emitting diode carrier board by a suitable force, for example, magnetic attraction or vacuum adsorption. The transfer holder 102 can control the movement of the micro light-emitting diode carrier board in three dimensions. More specifically, the electrode (for example, the first electrode 140a and the second electrode 140b which will be described later) of the micro light-emitting diode element 120 can be aligned with the bonding pad 132 on the receiving substrate 130, by moving the micro light-emitting diode carrier board along the X-axis or the Y-axis direction. Next, the micro light-emitting diode element 120 can be bonded to the receiving substrate 130 by moving the micro light-emitting diode carrier board downward along the Z-axis direction. Afterwards, the micro light-emitting diode element 120 can be separated from the substrate 110 of the micro light-emitting diode carrier board to complete the transferring process of the micro light-emitting diode element.

Referring to FIG. 1A, a plurality of bonding pads 132 are disposed on the upper surface of the receiving substrate 130. The receiving substrate 130 may be, for example, a display substrate, a light-emitting substrate, a substrate having functional elements such as thin film transistors or integrated circuits (ICs), or other types of circuit substrates, but is not limited thereto. The bonding pad 132 can be melted by heating and be in contact with the micro light-emitting diode element 120. Next, the bonding pad 132 is cooled to a solid state to firmly bond the micro light-emitting diode element 120 to the receiving substrate 130. The bonding pad 132 can provide a physical connection and an electrical connection between the micro light-emitting diode element 120 and the receiving substrate 130. The bonding pad 132 may include a suitable metal material, such as gold, silver, aluminum, tin, indium, alloys thereof, or combinations thereof.

Figure 2A:
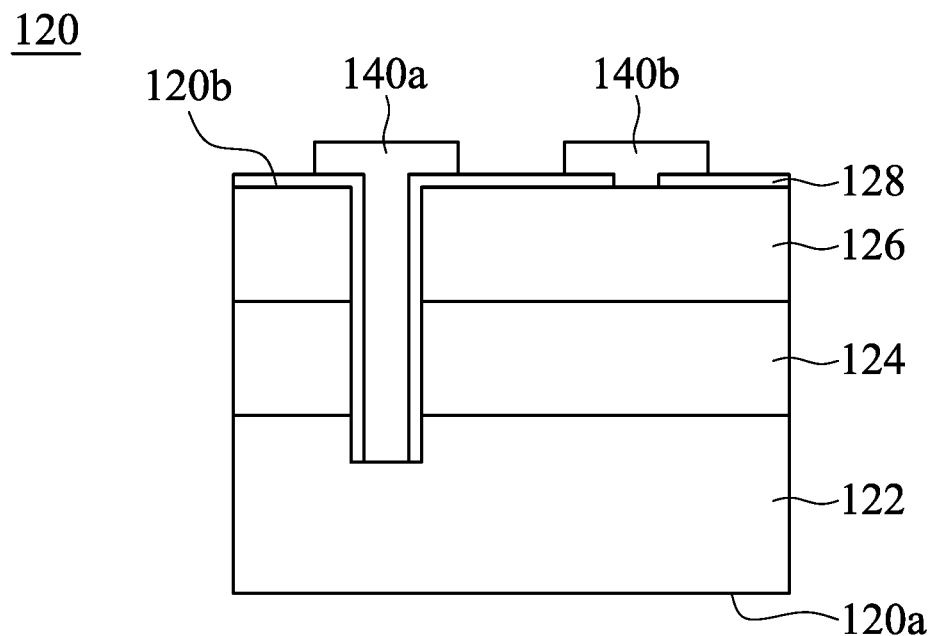
FIG. 2A and FIG. 2B are cross-sectional views showing the micro light-emitting diode element, in accordance with some embodiments of the disclosure.
Figure 2B:
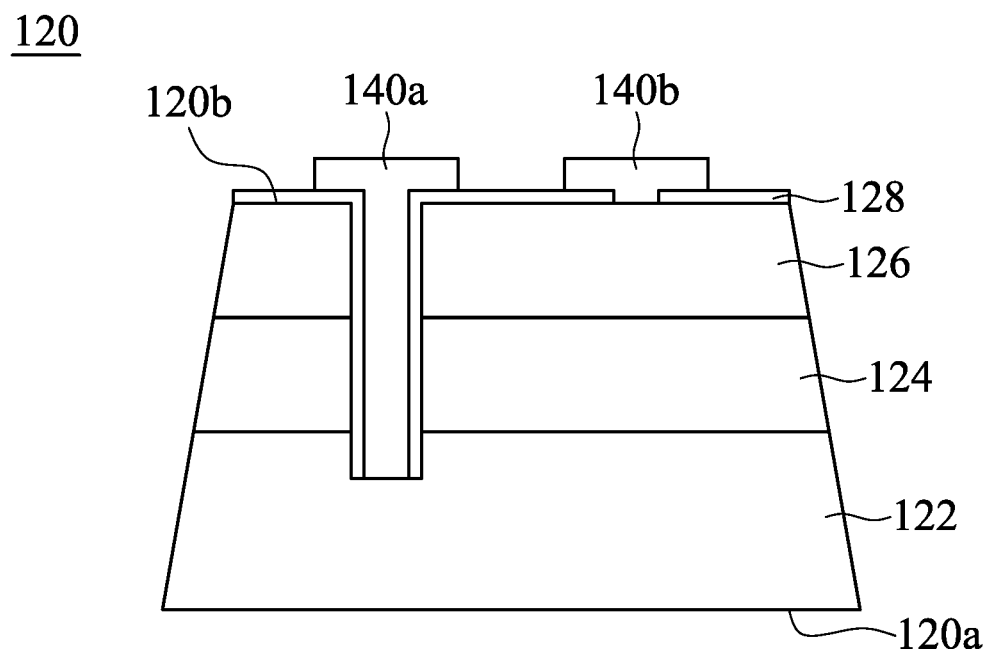

FIG. 2A and FIG. 2B are cross-sectional views showing the micro light-emitting diode element 120, in accordance with some embodiments of the disclosure. Referring to FIG. 2A, the micro light-emitting diode element 120 includes a first semiconductor layer 122, a light emitting layer 124, a second semiconductor layer 126, an insulating layer 128, a first electrode 140a, and a second electrode 140b. In some embodiments, the first semiconductor layer 122 is an n-type semiconductor layer, and the second semiconductor layer 126 is a p-type semiconductor layer. In other embodiments, the first semiconductor layer 122 is a p-type semiconductor layer, and the second semiconductor layer 126 is an re-type semiconductor layer. The light emitting layer 124 is disposed between the first semiconductor layer 122 and the second semiconductor layer 126. The first electrode 140a and the second electrode 140b are disposed over the second semiconductor layer 126, and the first electrode 140a passes through the second semiconductor layer 126 and the light emitting layer 124 and extends into the first semiconductor layer 122 and is in direct contact with the first semiconductor layer 122. The insulting layer 128 is disposed between the first electrode 140a and the light emitting layer 124, and between the first electrode 140a and the second semiconductor layer 126 to prevent the first electrode140a from being in contact with the light emitting layer 124 and the second semiconductor layer 126.

Referring to FIG. 2B, the micro light-emitting diode element 120 shown in FIG. 2B is similar to the micro light-emitting diode element 120 shown in FIG. 2A, and the difference is that the micro light-emitting diode element 120 shown in FIG. 2B has a sloped sidewall. In other words, the micro light-emitting diode element 120 of FIG. 2B has a trapezoidal shape having a narrow upper portion and a wide lower portion. As shown in FIG. 2A and FIG. 2B, the micro light-emitting diode element 120 has a lower surface 120a and an upper surface 120b. It should be noted that the micro light-emitting diode element 120 is upside down. In other words, the lower surface 120a of the micro light-emitting diode element 120 faces the substrate 110, and the upper surface 120b faces the receiving substrate 130. If the micro light-emitting diode element 120 shown in FIG. 2B is used to perform the transferring process, the micro light-emitting diode element 120 bonded to the receiving substrate 130 has an inverted trapezoidal shape having a wide upper portion and a narrow lower portion.

The micro light-emitting diode element 120 shown in FIG. 2A and FIG. 2B is merely illustrative and is not intended to be limiting. The cross-sectional profile of the micro light-emitting diode element 120 can be rectangular, trapezoidal, inverted trapezoidal, other suitable shapes, or a combination thereof. In FIG. 1A, in order to simplify the illustration, the cross-sectional profile of the micro light-emitting diode element 120 is only represented as a rectangular shape.

Still referring to FIG. 1A, the micro light-emitting diode carrier board includes a substrate structure and a plurality of micro light-emitting diode elements 120. The substrate structure includes a first surface (i.e., upper surface) 110a and a second surface (i.e., lower surface) 110b. The micro light-emitting diode elements 120 form an array and are disposed on the second surface 110b of the substrate structure. The substrate structure includes a substrate 110 and a bonding layer 150. The substrate 110 can carry and support the micro light-emitting diode element 120 in a transferring process. For example, the substrate 110 may be a plastic substrate, a ceramic substrate, a glass substrate, or a sapphire substrate. The bonding layer 150 may temporarily fix the micro light-emitting diode element 120 on the lower surface of the substrate 110 during the transferring process. When the micro light-emitting diode element 120 is bonded to the receiving substrate 130, the bonding layer 150 and the micro light-emitting diode element 120 can be separated by a suitable method. For example, the bonding layer 150 may be an optically decomposing or thermally decomposing adhesive material. Therefore, the bonding layer 150 and the micro light-emitting diode element 120 can be separated from each other by irradiating or heating the bonding layer 150 to reduce the adhesion of the bonding layer 150.

Figure 1B:
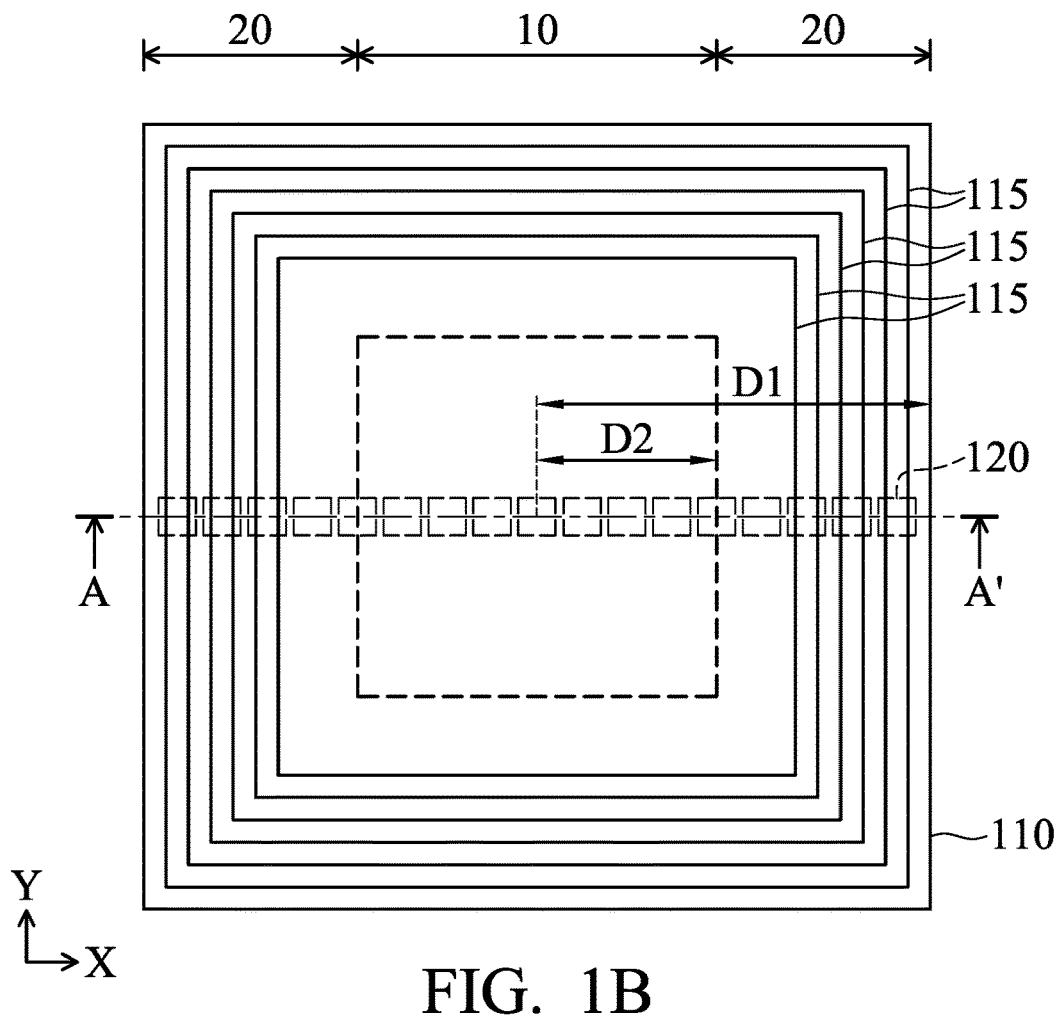
FIG. 1B is a top view of the micro light-emitting diode carrier board of FIG. 1A.

FIG. 1B is a top view of the micro light-emitting diode carrier board of FIG. 1A, and FIG. 1A is a cross-sectional view taken along line A-A' of FIG. 1B. Referring to FIG. 1A and FIG. 1B, when the substrate structure is viewed from a direction perpendicular to the substrate 110 (i.e., the Z-axis direction), the substrate structure has a central region 10 and a peripheral region 20 located outside the central region 10. In other words, in FIG. 1B, the area enclosed by the dashed frame is the central region 10, and the area between the dashed frame and the edge of the substrate 110 is the peripheral region 20. In order to simplify the illustration, only one row of micro light-emitting diode elements 120 are shown in FIG. 1B. Actually, the micro light-emitting diode elements 120 are arranged in an array on the micro light-emitting diode carrier board. For example, m×n micro light-emitting diode elements 120 are arranged in a matrix, with m and n being positive integers greater than zero, respectively, and generally greater than ten.

The definitions of the central region 10 and the peripheral region 20 are described in detail below. When a straight line (for example, the line A-A') sequentially passes through the center point of the central region 10, the edge of the central region 10, the peripheral region 20, and the edge of the substrate structure. There is a first linear distance D1 from the center point of the central region 10 to the edge of the substrate structure, and there is a second linear distance D2 from the center point to the edge of the central region 10. The second linear distance D2 is not more than 0.8 times the first linear distance D1, and is not less than 0.2 times the first linear distance D1. In some embodiments, the second linear distance D2 is equal to 0.5 times the first linear distance D1, as shown in FIG. 1B.

Referring to FIG. 1A and FIG. 1B, the substrate structure includes a patterned structure formed on the first surface 110a of the substrate 110, and the patterned structure includes a plurality of trenches 115. The trench 115 may be formed by a suitable process (such as, the etching process). In some embodiments, the trenches 115 are annular and arranged in a concentric shape when they are viewed from the Z-axis direction. Referring to FIG. 1B, the substrate 110 has a rectangular shape, and the plurality of trenches 115 are concentric rectangular rings. In the present embodiment, all of the trenches 115 are formed only in the peripheral region 20, and each of the trenches 115 is spaced apart from the adjacent trenches 115 by a certain distance. In other words, in the present embodiment, the patterned structure has a first pattern density (the first pattern density is 0) in the central region 10 and has a second pattern density in the peripheral region 20. The first pattern density is smaller than the second pattern density.

Figure 1C:
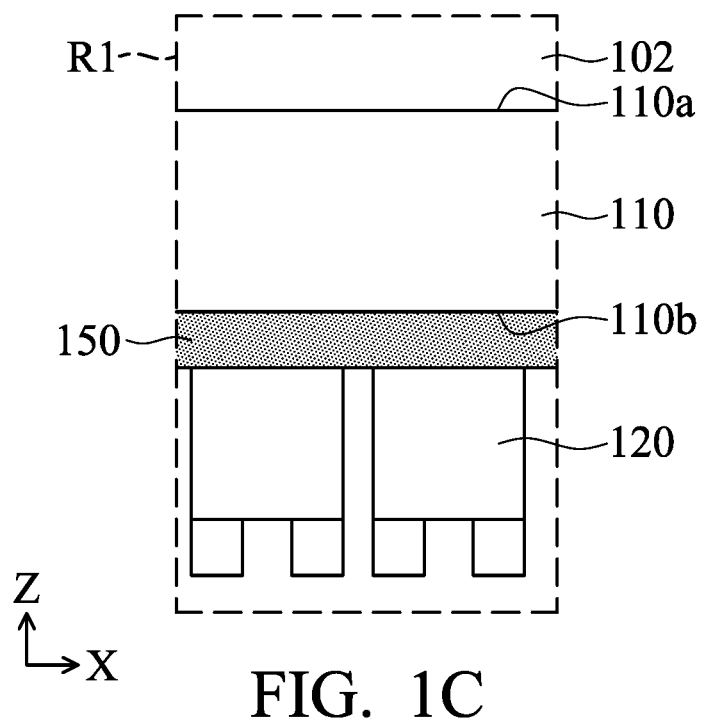
FIG. 1C is an enlarged cross-sectional view of the region R1 in FIG. 1A.
Figure 1D:
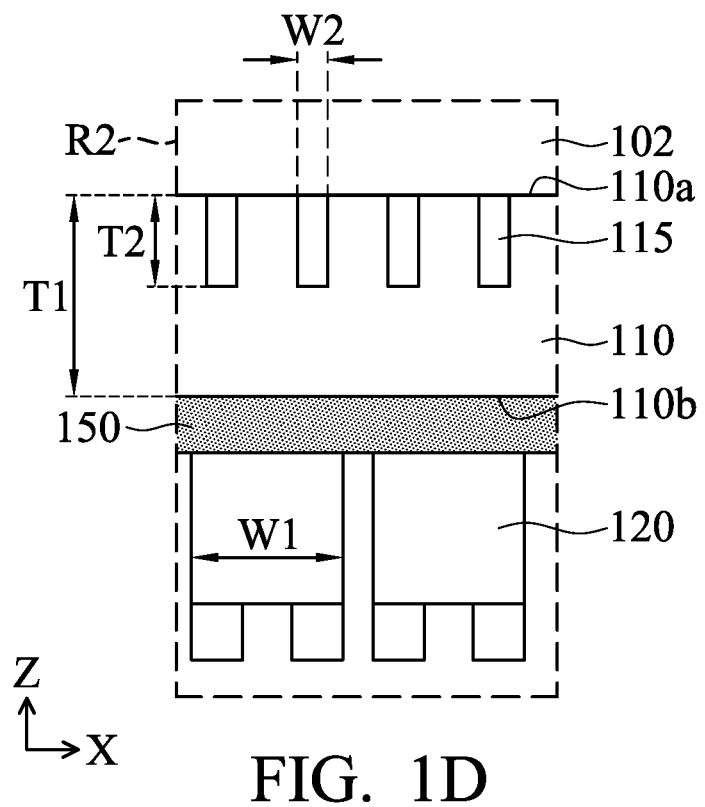
FIG. 1D is an enlarged cross-sectional view of the region R2 in FIG. 1A.

FIG. 1C is an enlarged cross-sectional view of the region R1 in FIG. 1A, and FIG. 1D is an enlarged cross-sectional view of the region R2 in FIG. 1A. Referring to FIG. 1A and FIG. 1C, no trench 115 is formed in the central region 10 of the substrate 110. On the other hand, referring to FIG. 1A and FIG. 1D, there are a plurality of trenches 115 in the peripheral region 20 of the substrate 110, and one micro light-emitting diode element 120 corresponds to at least one trench 115.

During the transferring process, the micro light-emitting diode element 120 is typically bonded to the receiving substrate 130 by a heating process. The high temperature environment may easily cause the substrate 110 to warp or bend. For example, the peripheral region 20 (particularly, the edge portion) of the substrate 110 may warp toward the receiving substrate 130. Therefore, the distance between each of the micro light-emitting diode elements 120 and the receiving substrate 130 is different. In this situation, when the micro light-emitting diode elements 120 located in the peripheral region 20 are in contact with the receiving substrate 130, the micro light-emitting diode elements 120 located in the central region 10 are still apart from the receiving substrate 130 by a distance. In order to make the micro light-emitting diode elements 120 located in the central region 10 to be in contact with the receiving substrate 130, it is necessary to apply pressure to the substrate 110 by the transfer holder 102 to continuously move the micro light-emitting diode carrier board downward. As a result, the micro light-emitting diode elements 120 located in the peripheral region 20 may be damaged or destroyed.

In the present embodiment, a plurality of trenches 115 are formed on the first surface 110a of the peripheral region 20 of the substrate 110. The distance between the substrates 110 on both sides of the trench 115 is variable. Therefore, when thermal energy is conducted into the substrate 110, the distance between the substrates 110 on both sides of the trench 115 may become larger or smaller. As a result, the degree of warpage of the substrate 110 can be reduced. Furthermore, when the micro light-emitting diode elements 120 located in the peripheral region 20 are in contact with the receiving substrate 130, the pressure on the micro light-emitting diode element 120 can be reduced or mitigated by the change in the distance between the substrates 110 on both sides of the trench 115. Therefore, the damage or destruction of the micro light-emitting diode element 120 can be reduced or avoided. According to the micro light-emitting diode carrier board provided in the present embodiment, the degree of the warpage of the substrate 110 can be reduced. Furthermore, even if the substrate 110 is warped or bended, the damage or destruction of the micro light-emitting diode element 120 can also be reduced or avoided by the micro light-emitting diode carrier board provided in the present embodiment. As a result, the reliability, yield and durability of the micro light-emitting diode structure can be significantly improved.

If the depth of the trench 115 is too small, the degree of change in the distance between the substrates 110 on both sides of the trench 115 is too small. Therefore, it is difficult to reduce the degree of warpage of the substrate 110, and it is also difficult to reduce the pressure applied to the micro light-emitting diode elements 120. As a result, it is disadvantageous to improve the reliability, yield and durability of the micro light-emitting diode structure. On the other hand, if the depth of the trench 115 is too large (for example, the depth is close to the thickness of the substrate 110), when the transfer holder 102 applies pressure to the substrate 110, the substrate 110 may be damaged or broken. Therefore, the position of the micro light-emitting diode elements 120 may be shifted, and the micro light-emitting diode elements 120 may also be damaged. As a result, it is disadvantageous to improve the yield of the micro light-emitting diode structure. The depth of the trench 115 may be controlled within a specific range. Referring to FIG. 1D, the substrate 110 has a thickness T1, and each of the trenches 115 has a trench depth T2. In some embodiments, the trench depth T2 is 10-70% of the thickness T1. In other embodiments, the trench depth T2 is 20-60% of the thickness T1. In still other embodiments, the trench depth T2 is 25-35% of the thickness T1.

In FIG. 1D, the width of the trench 115 is uniform from top to bottom. In some embodiments, the width of the trench 115 is tapered from top to bottom. In the present embodiment, the phrase "the width of the trench 115" refers to the width of the top of the trench 115. If the width of the trench 115 is too small, the degree of change in the distance between the substrates 110 on both sides of the trench 115 is too small. Therefore, it is difficult to reduce the degree of warpage of the substrate 110, and it is also difficult to reduce the pressure applied to the micro light-emitting diode elements 120. As a result, it is disadvantageous to improve the reliability, yield and durability of the micro light-emitting diode structure. On the other hand, if the width of the trench 115 is too large, the trench density is lowered. It is also difficult to reduce the degree of warpage of the substrate 110, and it is also difficult to reduce the pressure applied to the micro light-emitting diode elements 120. The width of the trench 115 may be controlled within a specific range. Referring to FIG. 1D, the micro light-emitting diode element 120 has an element width W1, and each of the trenches 115 has a trench width W2. The trench width W2 is smaller than the element width W1. More specifically, in some embodiments, the trench width W2 is 5-90% of the element width W1. In other embodiments, the trench width W2 is 10-60% of the element width W1. In still other embodiments, the trench width W2 is 15-30% of the element width W1.

If the pattern density of the trenches 115 (i.e., the number of trenches 115 per unit area) is higher, the effect of reducing the warpage of the substrate 110 is better. However, if the pattern density of the trenches 115 is too high or too low, it is difficult to reduce the degree of warpage of the substrate 110, and it is also difficult to reduce the pressure applied to the micro light-emitting diode elements 120. The density of the trenches 115 may be controlled within a specific range. For example, one or more trenches 115 overlap one of the micro light-emitting diode elements 120. In the present specification, the phrase "the micro light-emitting diode element overlaps (or corresponds to) the trench" means that the orthographic projection of the micro light-emitting diode element on the XY plane overlaps with (or corresponds to) the orthographic projection of the trench on the XY plane. In the present embodiment, two trenches 115 overlap one of the micro light-emitting diode elements 120, as shown in FIG. 1D. In other embodiments, three trenches 115 overlap one of the micro light-emitting diode elements 120. In other embodiments, four trenches 115 overlap one of the micro light-emitting diode elements 120.

Figure 3A:
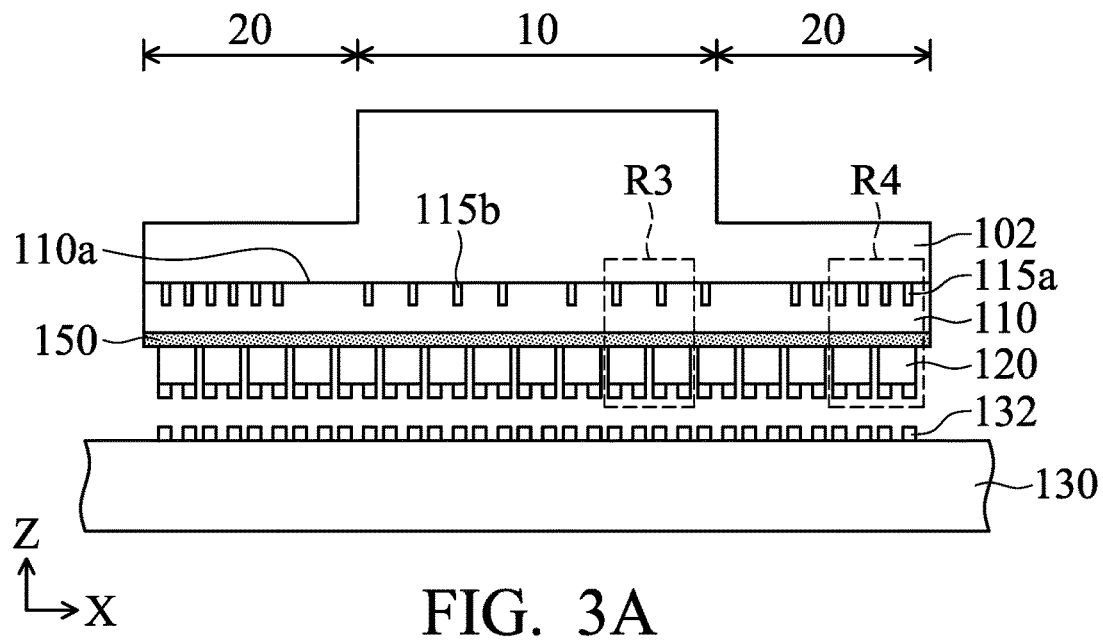
FIG. 3A is a cross-sectional view corresponding to a transferring process of the micro light-emitting diode elements, in accordance with other embodiments of the disclosure.
Figure 3B:
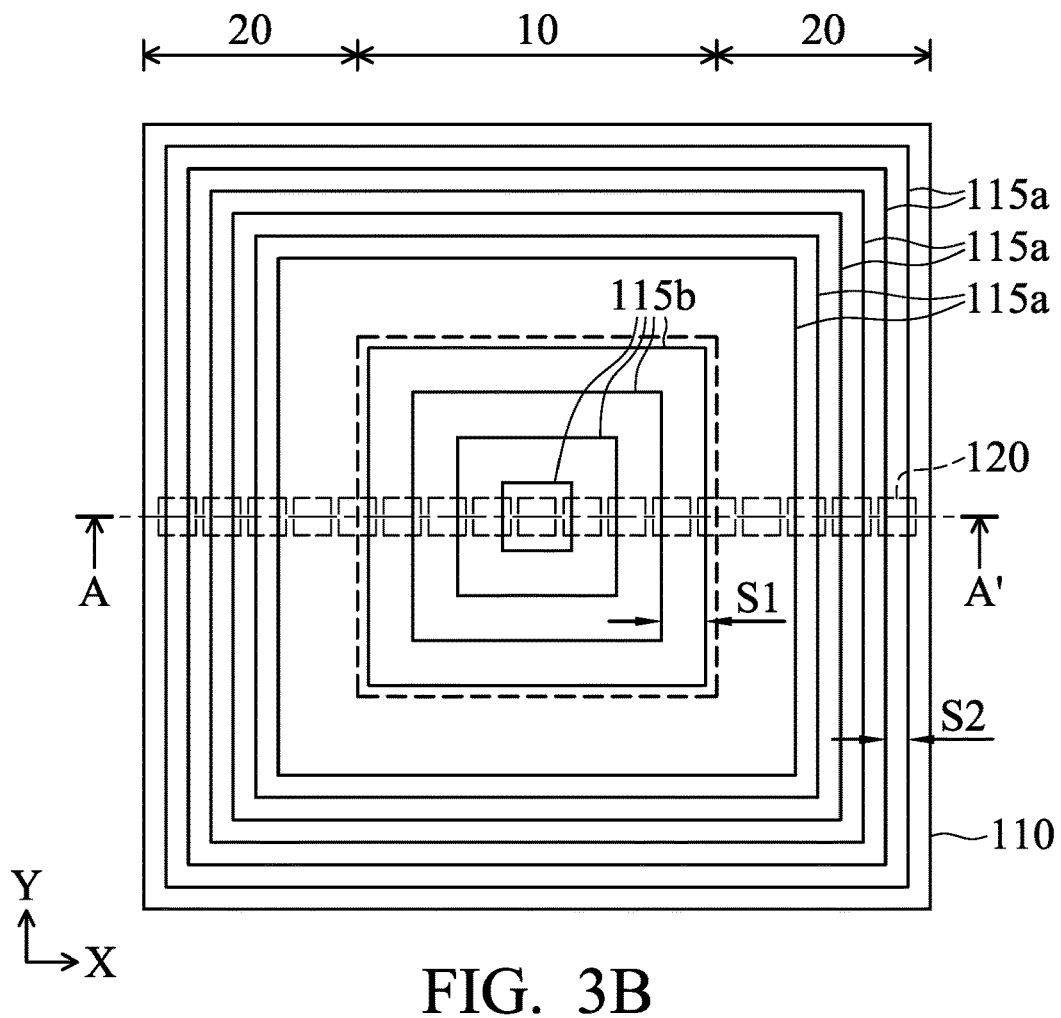
FIG. 3B is a top view of the micro light-emitting diode carrier board of FIG. 3A.
Figure 3C:
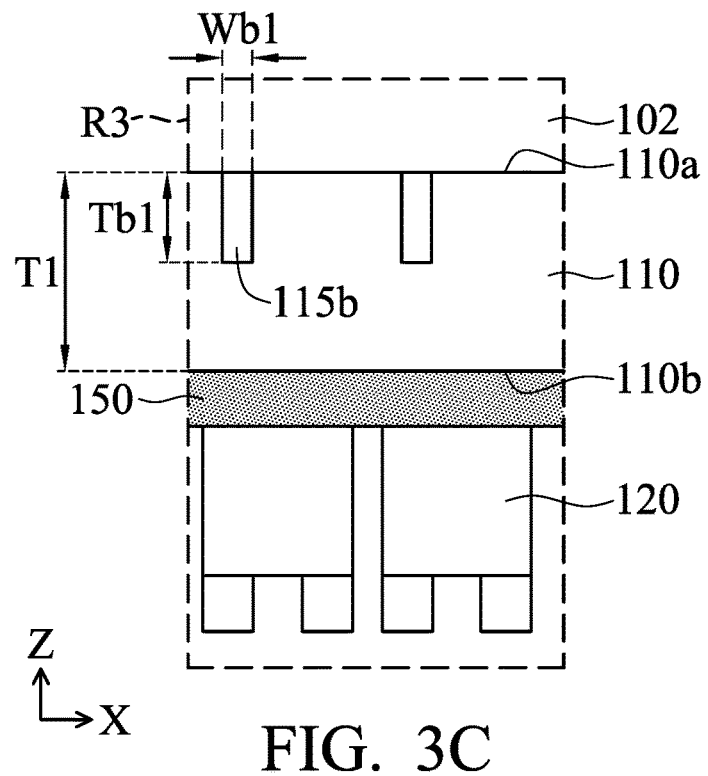
FIG. 3C is an enlarged cross-sectional view of the region R3 in FIG. 3A.
Figure 3D:
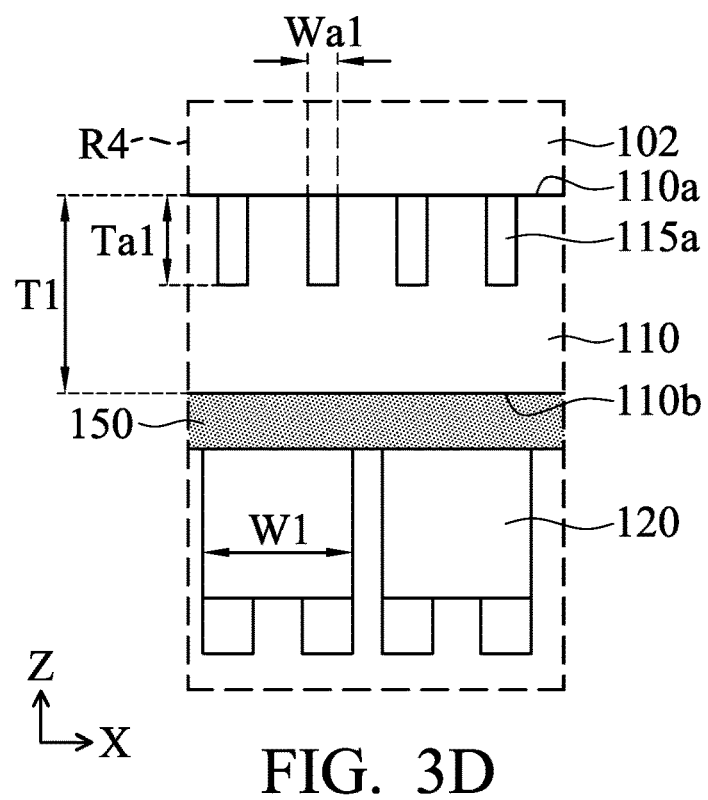
FIG. 3D is an enlarged cross-sectional view of the region R4 in FIG. 3A.

FIG. 3A is a cross-sectional view corresponding to a transferring process of the micro light-emitting diode elements, in accordance with other embodiments of the disclosure. FIG. 3B is a top view of the micro light-emitting diode carrier board of FIG. 3A, and FIG. 3A is a cross-sectional view taken along line A-A' of FIG. 3B. FIG. 3C is an enlarged cross-sectional view of the region R3 in FIG. 3A. FIG. 3D is an enlarged cross-sectional view of the region R4 in FIG. 3A. FIG. 3A to FIG. 3D are similar to FIG. 1A to FIG. 1D, respectively. In FIG. 3A to FIG. 3D, the elements that are the same as those shown in FIG. 1A to FIG. 1D are denoted by the same reference numerals. In order to simplify the description, the elements similar to those shown in FIG. 1A to FIG. 1D and the steps for forming the same are not described in detail herein.

The micro light-emitting diode carrier board shown in FIG. 3A is similar to the micro light-emitting diode carrier board shown in FIG. 1A, and the difference is that the substrate 110 shown in FIG. 3A includes first trenches 115a and second trenches 115b. Referring to FIG. 3A and FIG. 3B, the first trench 115a and the second trench 115b are both annular and arranged in a concentric shape when they are viewed from the Z-axis direction. The first trenches 115a are formed in the peripheral region 20, and the second trenches 115b are formed in the central region 10. In the central region 10, two adjacent second trenches 115b are spaced apart by a first space S1. In the peripheral region 20, two adjacent first trenches 115a are spaced apart by a second space S2. The second space S2 is smaller than the first space S1. In other words, in the present embodiment, the patterned structure has a first pattern density in the central region 10 and has a second pattern density in the peripheral region 20. The first pattern density is smaller than the second pattern density.

In some situations, the warpage may also occur in the central region 10 of the substrate 110. The degree of warpage in the central region 10 may be relatively slight compared to the degree of warpage in the peripheral region 20. In the present embodiment, the first trenches 115a and the second trenches 115b are respectively formed on the peripheral region 20 and the central region 10 of the substrate 110. As described above, the degree of warpage of the substrate 110 can be reduced, and damage or destruction of the micro light-emitting diode elements 120 can be reduced or avoided. As a result, the reliability, yield, and durability of the micro light-emitting diode structure can be significantly improved. Furthermore, in the present embodiment, the pattern density of the patterned structure may be adjusted according to the degree of warpage. For example, in the region where the degree of warpage is higher, the pattern density of the patterned structure is higher. Therefore, the reliability, yield, and durability of the micro light-emitting diode structure can be further improved. In order to significantly reduce the degree of warpage of the substrate 110, the ratio S2/S1 of the second space S2 to the first space Si may be controlled within a specific range. In some embodiments, the ratio S2/S1 of the second space S2 to the first space S1 is 0.1-0.8. In other embodiments, the ratio S2/S1 of the second space S2 to the first space S1 is 0.2-0.6. In still other embodiments, the ratio S2/S1 of the second space S2 to the first space S1 is 0.3-0.4.

Furthermore, the depth Ta1 of the first trench 115a and the depth Tb1 of the second trench 115b may be identical to each other or different from each other. In some embodiments, the depth Ta1 of the first trench 115a and the depth Tb1 of the second trench 115b may independently be in the range of the trench depth T2 described above. The width Wa1 of the first trench 115a and the width Wb1 of the second trench 115b may be identical to each other or different from each other. In some embodiments, the width Wa1 of the first trench 115a and the width Wb1 of the second trench 115b may independently be in the range of the trench width W2 described above.

Figure 4:
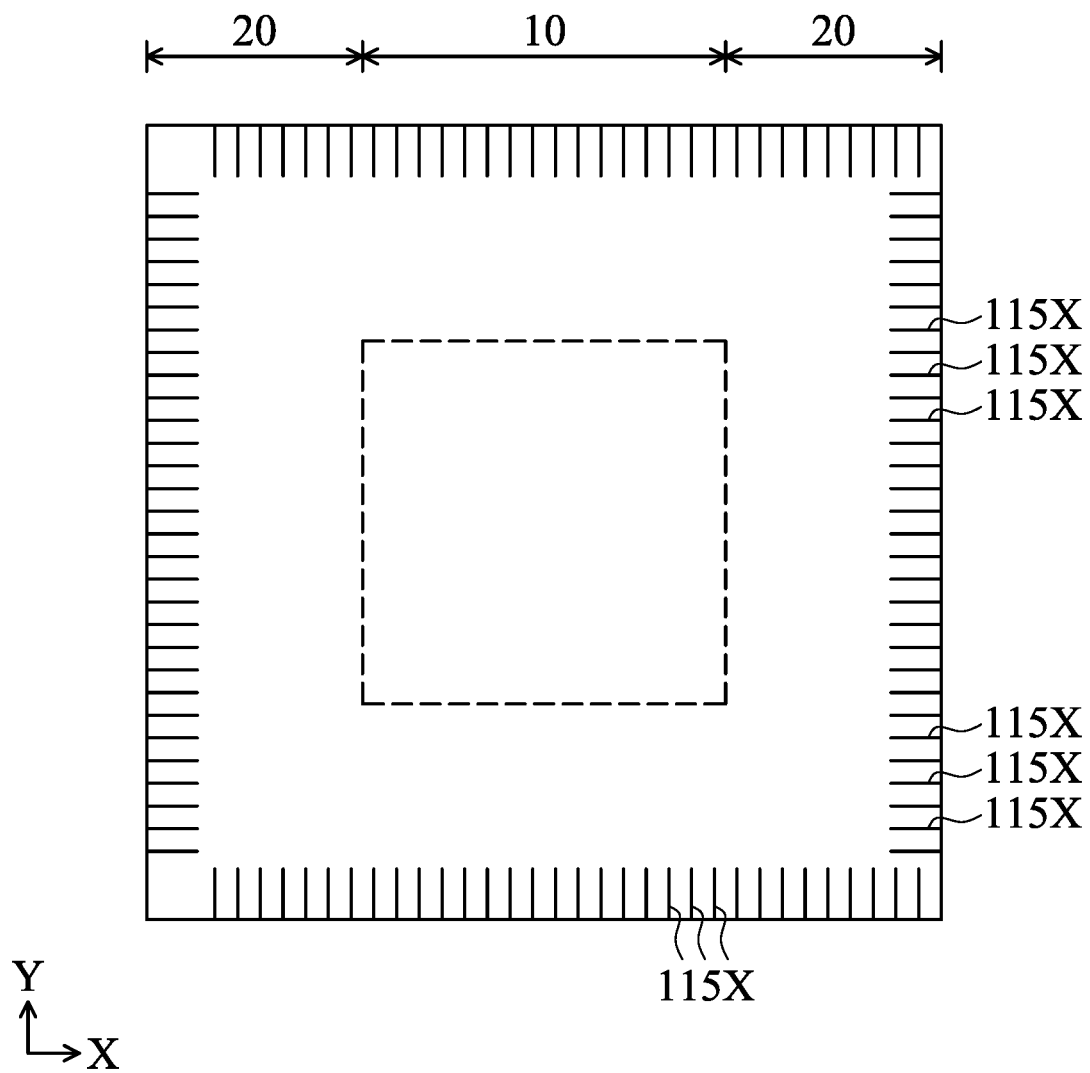
FIG. 4 is a top view of the substrate, in accordance with some embodiments of the disclosure.

FIG. 4 is a top view of the substrate 110, in accordance with some embodiments of the disclosure. The substrate 110 shown in FIG. 4 is similar to the substrate 110 shown in FIG. 1B, and the difference is that the trenches 115X shown in FIG. 4 are arranged differently. Referring to FIG. 4, a plurality of trenches 115X are spaced apart from each other, and each of the trenches 115X extends from the edge of the substrate 110 toward the central region 10, when they are viewed from the Z-axis direction. In the present embodiment, all of the trenches 115X are formed only in the peripheral region 20. Therefore, if the degree of warpage of the peripheral region 20 is significantly greater than the degree of warpage of the central region 10, the reliability, yield and durability of the micro light-emitting diode structure can be significantly improved by using the micro light-emitting diode carrier board of the present embodiment. In some embodiments, the depth of the trench 115X falls into the range of the trench depth T2 described above, and the width of the trench 115X falls into the range of the trench width W2 described above.

Figure 5:
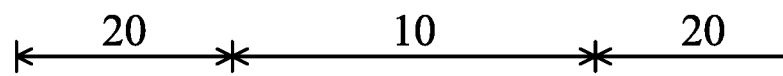
FIG. 5 is a top view of the substrate, in accordance with some embodiments of the disclosure.
Figure 5:
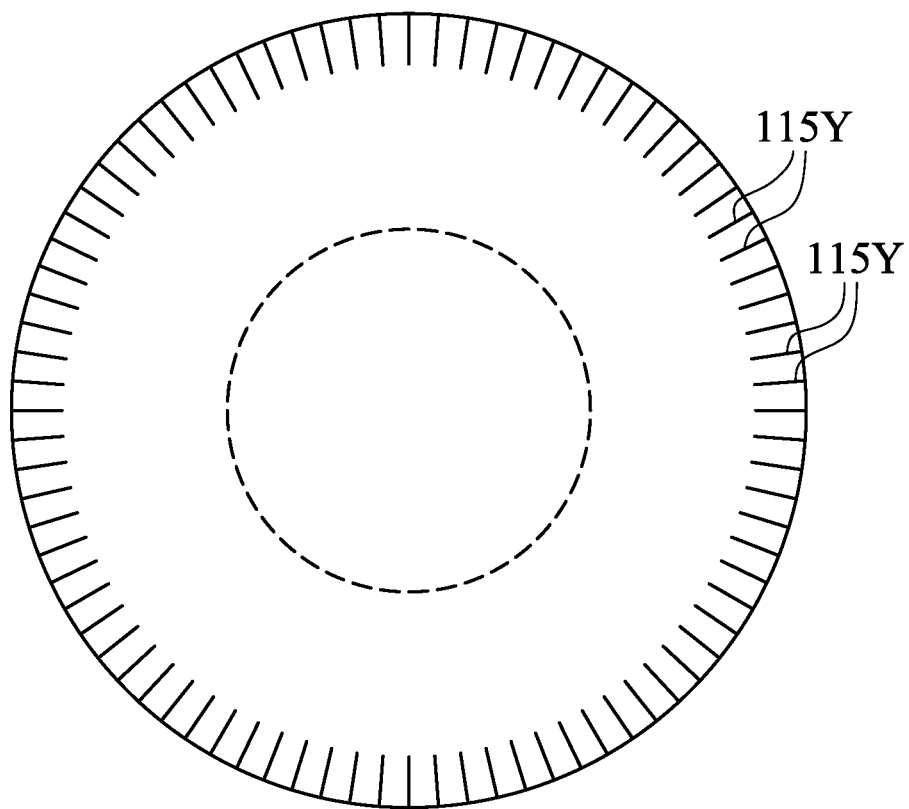
Figure 5:
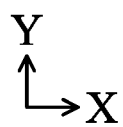

FIG. 5 is a top view of the substrate 110, in accordance with some embodiments of the disclosure. The substrate 110 shown in FIG. 5 is similar to the substrate 110 shown in FIG. 4, and the difference is that the substrate 110 shown in FIG. 5 has a circular shape. Referring to FIG. 5, a plurality of trenches 115Y are spaced apart from each other, and each of the trenches 115Y extends from the edge of the substrate 110 toward the central region 10, when they are viewed from the Z-axis direction. In the present embodiment, all of the trenches 115Y are formed only in the peripheral region 20. As described above, if the degree of warpage of the peripheral region 20 is significantly greater than the degree of warpage of the central region 10, the reliability, yield and durability of the micro light-emitting diode structure can be significantly improved by using the micro light-emitting diode carrier board of the present embodiment. In some embodiments, the depth of the trench 115Y falls into the range of the trench depth T2 described above, and the width of the trench 115Y falls into the range of the trench width W2 described above.

Figure 6A:
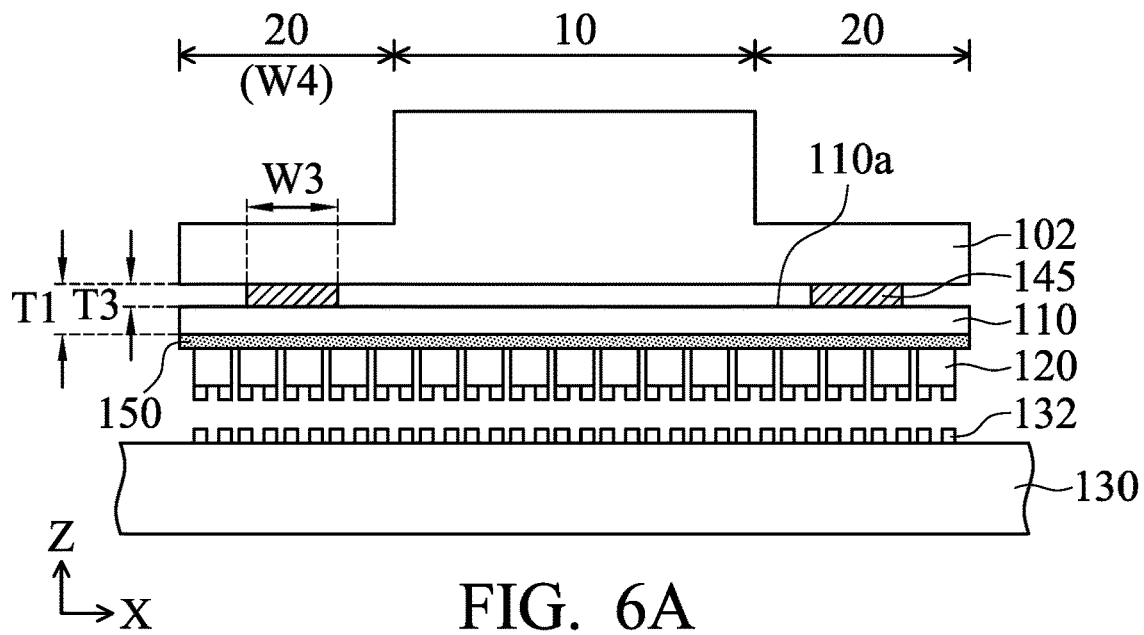
FIG. 6A is a cross-sectional view corresponding to a transferring process of the micro light-emitting diode elements, in accordance with other embodiments of the disclosure.
Figure 6B:
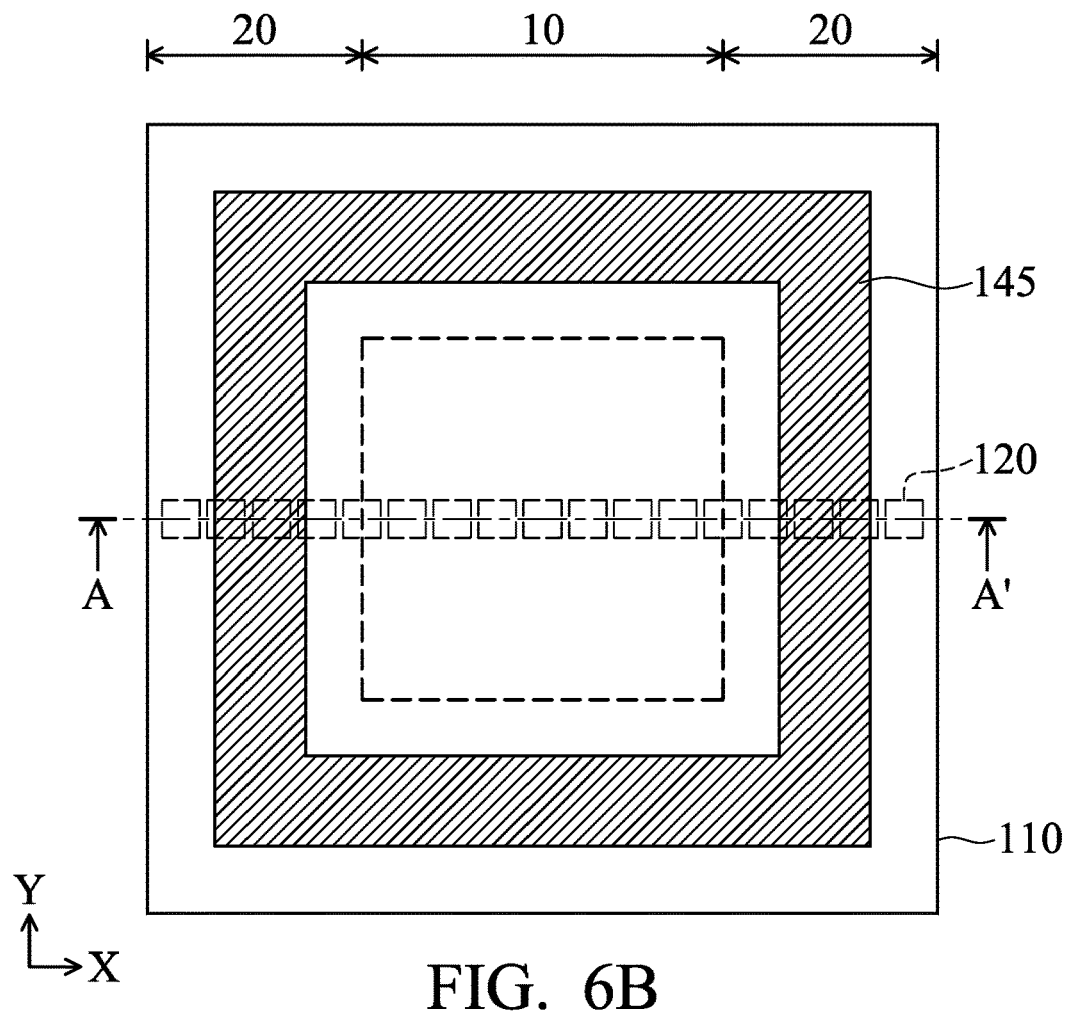
FIG. 6B is a top view of the micro light-emitting diode carrier board of FIG. 6A.

FIG. 6A is a cross-sectional view corresponding to a transferring process of the micro light-emitting diode elements, in accordance with other embodiments of the disclosure. FIG. 6B is a top view of the micro light-emitting diode carrier board of FIG. 6A, and FIG. 6A is a cross-sectional view taken along line A-A' of FIG. 6B. FIG. 6A is a cross-sectional view taken along line A-A' of FIG. 6B. FIG. 6A and FIG. 6B are similar to FIG. 1A and FIG. 1B, respectively. In FIG. 6A and FIG. 6B, the elements that are the same as those shown in FIG. 1A and FIG. 1B are denoted by the same reference numerals. In order to simplify the description, the elements similar to those shown in FIG. 1A to FIG. 1D and the steps of forming the same are not described in detail herein.

Referring to FIG. 6A, the patterned structure includes a buffering material 145 formed on the first surface 110a of the substrate 110. Referring to FIG. 6B, the buffering material 145 is located in the peripheral region 20 and surrounds the central region 10, when it is viewed from the Z-axis direction. The buffering material 145 is formed on the first surface 110a of the peripheral region 20 of the substrate 110. When the transfer holder 102 applies pressure to the substrate 110 which is bended due to thermal stress (for example, the edge of the substrate 110 approaches the receiving substrate 130), the pressure applied to the central region 10 and the peripheral region 20 can be balanced by the buffering material 145. As a result, the reliability, yield and durability of the micro light-emitting diode structure can be significantly improved.

In order to balance the pressure applied to the micro light-emitting diode elements 120 in the central region 10 and the peripheral region 20, the position and thickness of the buffering material 145 may be controlled within a specific range. Referring to FIG. 6A, the thickness of the substrate 110 is T1, and the buffering material 145 has a thickness T3. In some embodiments, the thickness T3 of the buffering material 145 is 5-30% of the thickness T1 of the substrate 110. In some embodiments, in order to further reduce the accumulation of thermal stress, the material of the buffering material 145 may have a high thermal conductivity. For example, the buffering material 145 may be a thin metal film. Furthermore, in order to provide a better buffering effect, the material of the buffering material 145 may have a low Young's modulus. In some embodiments, the material of the buffering material 145 may be an organic material having a Young's modulus in a range from 2.5 GPa to 10 Gpa. For example, the buffering material 145 may be benzocyclobutene (BCB), polyimine (PI), or other suitable organic material.

FIG. 6A, the width of the buffering material 145 is uniform from top to bottom. In some embodiments, the width of the buffering material 145 is tapered from top to bottom. In the present specification, the phrase "the width of the buffering material 145" refers to the width of the top portion of the buffering material 145 (that is, the portion in contact with the transfer holder 102). In order to more effectively distribute the pressure throughout the micro light-emitting diode carrier board, the width of the buffering material 145 may be controlled within a specific range. Referring to FIG. 6A, the width of the peripheral region 20 is W4, and the buffering material 145 has a width W3. In some embodiments, the width W3 of the buffering material 145 is 20-90% of the width W4. In other embodiments, the width W3 of the buffering material 145 is 30-70% of the width W4. In still other embodiments, the width W3 of the buffering material 145 is 40-60% of the width W4.

Figure 7:
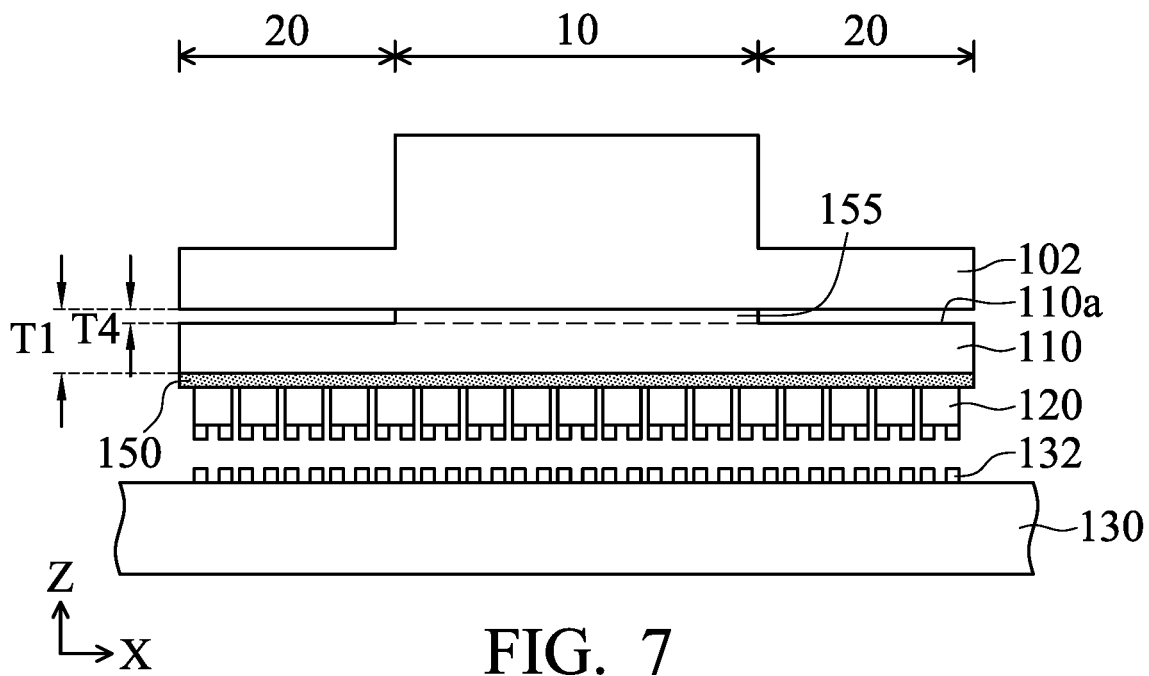
FIG. 7 is a cross-sectional view corresponding to a transferring process of the micro light-emitting diode elements, in accordance with other embodiments of the disclosure.

FIG. 7 is a cross-sectional view corresponding to a transferring process of the micro light-emitting diode elements, in accordance with other embodiments of the disclosure. FIG. 7 is similar to FIG. 1A. In FIG. 7, the elements that are the same as those shown in FIG. 1A are denoted by the same reference numerals. In order to simplify the description, the elements similar to those shown in FIG. 1A and the steps of forming the same are not described in detail herein.

Referring to FIG. 7, the patterned structure includes a protruding portion 155 formed on the first surface 110a of the substrate 110. The protruding portion 155 can be formed by partially etching and removing the peripheral region 20 of the substrate 110. The protruding portion 155 is integrated with the substrate structure. The protruding portion 155 is located in the central region 10 when it is viewed from the Z-axis direction. In the present embodiment, the protruding portion 155 is formed on the first surface 110a of the central region 10 of the substrate 110. When the transfer holder 102 applies pressure to the substrate 110, the pressure will be concentrated in the central region 10. Furthermore, the substrate 110 located in the peripheral region 20 is not directly contact with the transfer holder 102, and there is some space existing between the substrate 110 and the transfer holder 102. When the transfer holder 102 applies pressure to the substrate 110, most of the pressure is applied to the central region 10, thereby reducing or mitigating the pressure applied to the micro light-emitting diode elements 120 located in the peripheral region 20. Therefore, the damage or destruction of the micro light-emitting diode element 120 located in the peripheral region 20 can be reduced or avoided. As a result, the reliability, yield and durability of the micro light-emitting diode structure can be significantly improved.

In order to significantly reduce the pressure applied to the micro light-emitting diode element 120 located in the peripheral region 20, the height of the protruding portion 155 may be controlled within a specific range. Referring to FIG. 7, the central region 10 of the substrate 110 has a thickness T1, and the protruding portion 155 has a protrusion height T4. In the present embodiment, the protrusion height T4 refers to the height protruding from the upper surface of the peripheral region 20. In some embodiments, the protrusion height T4 is 5-50% of the thickness T1. In other embodiments, the protrusion height T4 is 10-30% of the thickness T1. If the protrusion height T4 is too large, the pressure applied to the central region 10 will be much greater than the pressure applied to the peripheral region 20. This will cause the micro light-emitting diode elements 120 of the central region 10 to be crushed. On the other hand, if the protrusion height T4 is too small, the pressure applied to the peripheral region 20 cannot be significantly reduced.

Figure 8:
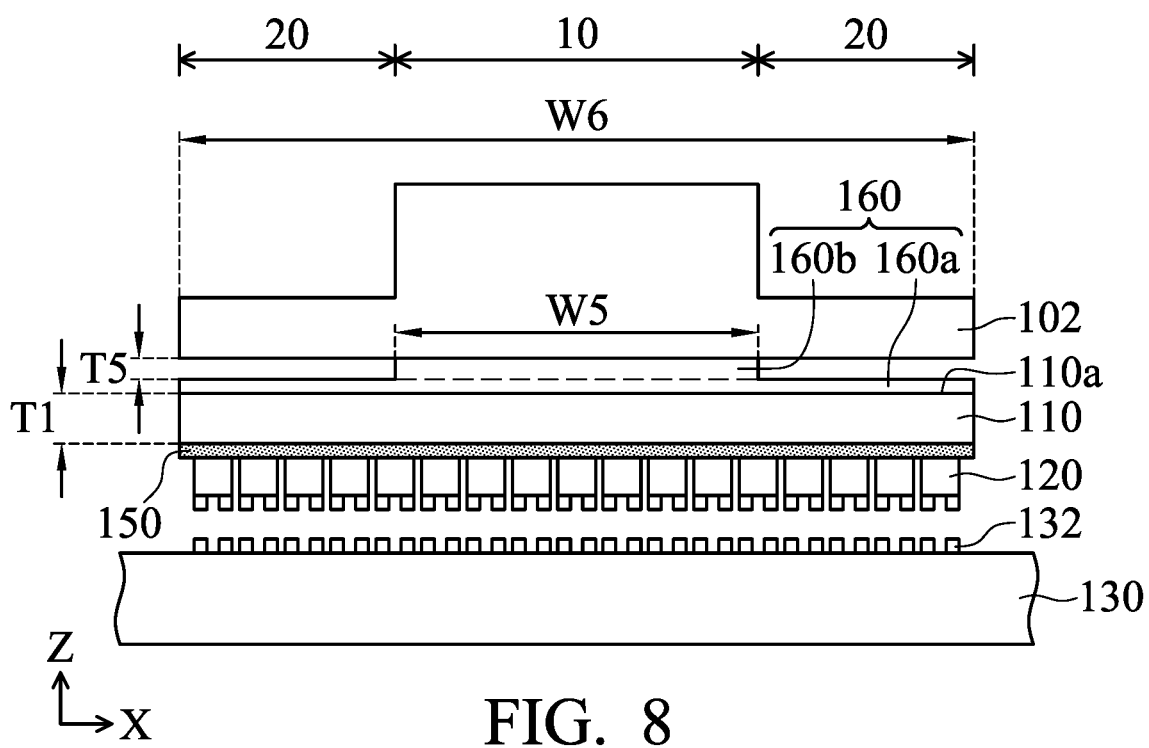
FIG. 8 is a cross-sectional view corresponding to a transferring process of the micro light-emitting diode elements, in accordance with other embodiments of the disclosure.

FIG. 8 is a cross-sectional view corresponding to a transferring process of the micro light-emitting diode elements, in accordance with other embodiments of the disclosure. FIG. 8 is similar to FIG. 1A. In FIG. 8, the elements that are the same as those shown in FIG. 1A are denoted by the same reference numerals. In order to simplify the description, the elements similar to those shown in FIG. 1A and the steps of forming the same are not described in detail herein.

Referring to FIG. 8, a patterned film 160 is adhered to the first surface 110a of the substrate 110. The patterned film 160 includes a flat portion 160a and a protruding portion 160b. In some embodiments, a film may be formed fully over the first surface 110a, and then the film in the peripheral region 20 is partially removed, thereby forming the patterned film 160. In other embodiments, a film may be formed fully over the first surface 110a, and then the same film is formed partially only in the central region 10, thereby forming the patterned film 160. The protruding portion 160b is located in the central region 10 when it is viewed from the Z-axis direction. In the present embodiment, the patterned structure is the patterned film 160 adhering on the first surface 110a of the substrate structure 110. In the present embodiment, the protruding portion 160b is formed on the first surface 110a of the central region 10 of the substrate 110. As described above, when the transfer holder 102 applies pressure to the substrate 110, the pressure will be concentrated in the central region 10, and the pressure applied to the micro light-emitting diode element 120 located in the peripheral region 20 may be reduced or mitigated. Therefore, damage or destruction of the micro light-emitting diode element 120 can be reduced or avoided. As a result, the reliability, yield, and durability of the micro light-emitting diode structure can be significantly improved. In some embodiments, in order to further reduce the accumulation of thermal stress, the material of the patterned film 160 may have a high thermal conductivity. For example, the patterned film 160 may be a thin metal film. Furthermore, in order to provide a better buffering effect, the material of the patterned film 160 may have a low Young's modulus. In some embodiments, the material of the patterned film 160 may be an organic material having a Young's modulus in a range from 2.5 GPa to 10 Gpa. For example, the patterned film 160 may be benzocyclobutene (BCB), polyimine (PI), or other suitable organic material.

In order to significantly reduce the pressure applied to the micro light-emitting diode element 120 located in the peripheral region 20, the height of the protruding portion 160b may be controlled within a specific range. Referring to FIG. 8, the thickness of the substrate 110 is T1, and the protruding portion 160b has a protrusion height T5. In some embodiments, the protrusion height T5 is 5-50% of the thickness T1 of the substrate 110. In other embodiments, the protrusion height T5 is 10-30% of the thickness T1 of the substrate 110.

In order to more effectively concentrate the pressure on the central region 10, the width of the protruding portion 160b may be controlled within a specific range. Referring to FIG. 8, the substrate 110 has a width W6, and the protruding portion 160b has a protrusion width W5. In some embodiments, the protrusion width W5 is 5-70% of the width W6. In other embodiments, the protrusion width W5 is 10-50% of the width W6. In still other embodiments, the protrusion width W5 is 15-25% of the width W6. In the present embodiment, the protrusion width W5 is 50% of the width W6.

Furthermore, if the thermal expansion coefficient of the bonding layer 150 is different from the thermal expansion coefficient of the substrate 110, the substrate 110 may be warped or bended. In this situation, if the patterned film 160 having the same or similar thermal expansion coefficient as the bonding layer 150 is formed on the first surface 110a, the thermal stresses applied on the upper surface and the lower surface of the substrate 110 may be offset by each other. As a result, the warpage or bending of the substrate 110 can be avoided, and the reliability, yield, and durability of the micro light-emitting diode structure can be significantly improved. In some embodiments, the thermal expansion coefficient and the thickness of the patterned film 160 are the same as or similar to the thermal expansion coefficient and the thickness of the bonding layer 150, respectively.

Figure 9A:
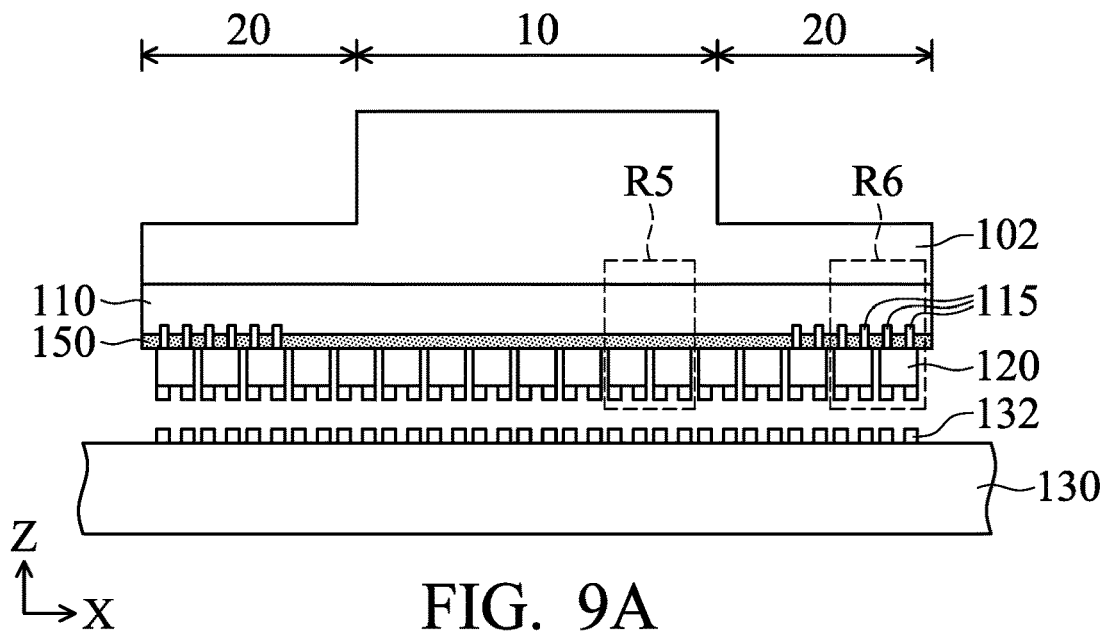
FIG. 9A is a cross-sectional view corresponding to a transferring process of the micro light-emitting diode elements, in accordance with other embodiments of the disclosure.
Figure 9B:
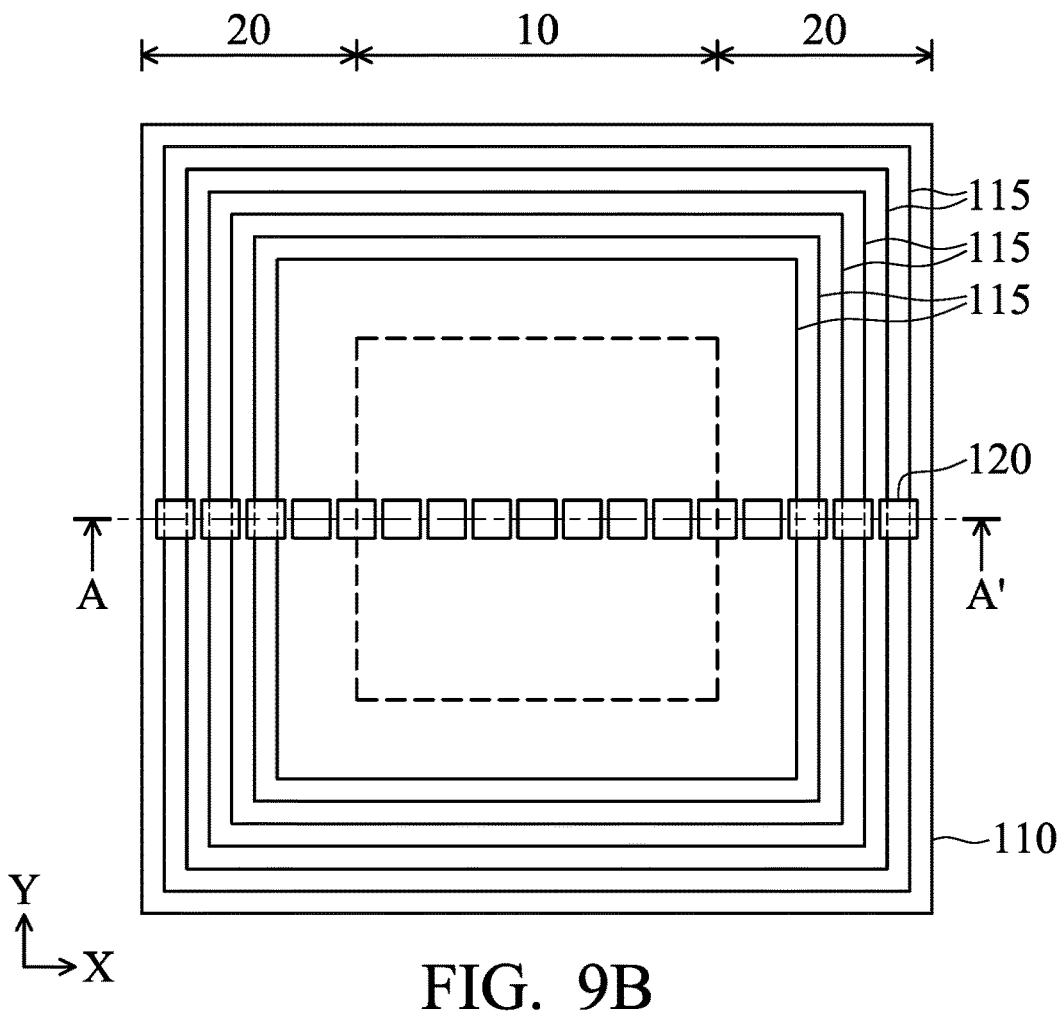
FIG. 9B is a bottom view of the micro light-emitting diode carrier board of FIG. 9A.
Figure 9C:
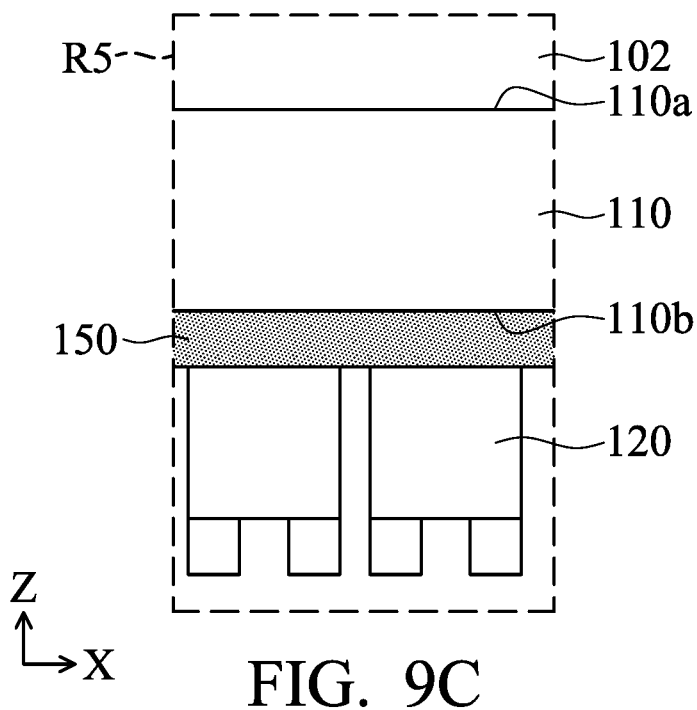
FIG. 9C is an enlarged cross-sectional view of the region R5 in FIG. 9A.
Figure 9D:
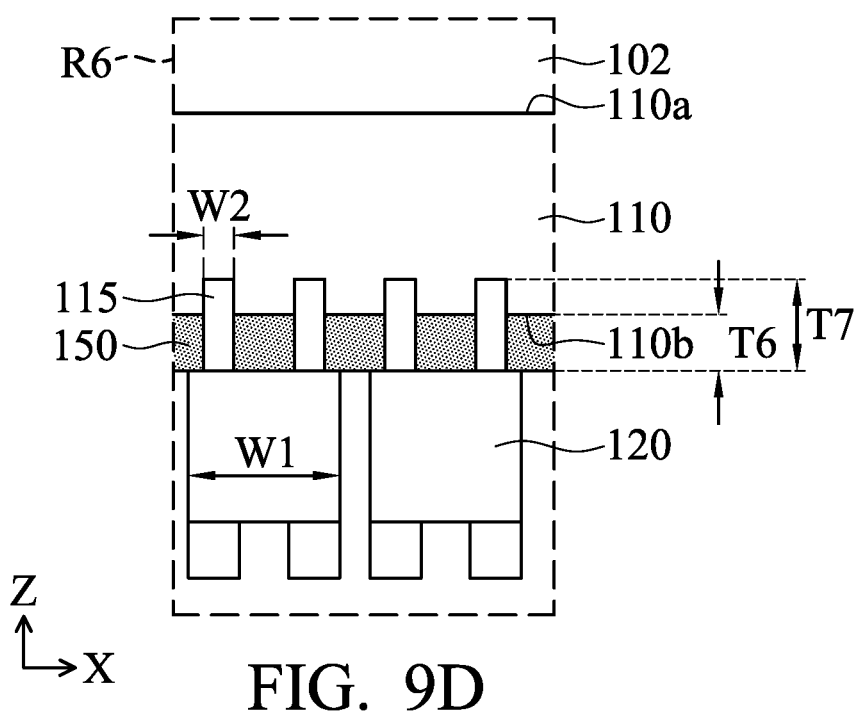
FIG. 9D is an enlarged cross-sectional view of the region R6 in FIG. 9A.

FIG. 9A is a cross-sectional view corresponding to a transferring process of the micro light-emitting diode elements, in accordance with other embodiments of the disclosure. FIG. 9B is a bottom view of the micro light-emitting diode carrier board of FIG. 9A, and FIG. 9A is a cross-sectional view taken along line A-A' of FIG. 9B. FIG. 9C is an enlarged cross-sectional view of the region R5 in FIG. 9A. FIG. 9D is an enlarged cross-sectional view of the region R6 in FIG. 9A. FIG. 9A to FIG. 9D are similar to FIG. 1A to FIG. 1D, respectively. In FIG. 9A to FIG. 9D, the elements that are the same as those shown in FIG. 1A to FIG. 1D are denoted by the same reference numerals. In order to simplify the description, the elements similar to those shown in FIG. 1A to FIG. 1D and the steps of forming the same are not described in detail herein.

The micro light-emitting diode carrier board shown in FIG. 9A is similar to the micro light-emitting diode carrier board shown in FIG. 1A, and the difference is the positions of the trenches 115 shown in FIG. 9A. Referring to FIG. 9A to FIG. 9D, the patterned structure is formed on the second surface 110b of the substrate 110, and the patterned structure includes a plurality of trenches 115. The trenches 115 may be formed by a suitable process (such as, an etching process). In some embodiments, the trenches 115 are annular and arranged in a concentric shape when they are viewed from the Z-axis direction. The substrate 110 is rectangular, and the plurality of trenches 115 are concentric rectangular rings, as shown in FIG. 9B. In the peripheral region 20 of the substrate 110, one micro light-emitting diode element 120 corresponds to at least one trench 115, as shown in FIG. 9D. In the present embodiment, all of the trenches 115 are formed only in the peripheral region 20, and each of the trenches 115 is spaced apart from the adjacent trenches 115 by a certain distance. In other words, in the present embodiment, the patterned structure has a first pattern density (the first pattern density is 0) in the central region 10 and has a second pattern density in the peripheral region 20. The first pattern density is smaller than the second pattern density.

As described above, the difference in thermal expansion coefficient between the materials or the unevenness in the heating process may cause the substrate 110 to warp or bend. In the present embodiment, by forming the trenches 115 on the second surface 110b, the substrate 110 and the bonding layer 150 located in the peripheral region 20 can become discontinuous. In other words, in the peripheral region 20, the warpage or bending due to the difference in thermal expansion coefficient can be reduced or avoided. As a result, the damage or destruction of the micro light-emitting diode element 120 can be reduced or avoided, thereby significantly improving the reliability, yield and durability of the micro light-emitting diode structure.

Referring to FIG. 9D, the bonding layer 150 has a thickness T6, and each of the trenches 115 has a trench depth T7. The trench depth T7 is greater than the thickness T6.

In FIG. 9D, the width of the trench 115 is uniform from the top to the bottom. In some embodiments, the width of the trench 115 is tapered from the bonding layer 150 to the substrate 110. In the present specification, the phrase "the width of the trench 115" refers to the width of the portion of the trench 115 where the bonding layer 150 is in contact with the micro light-emitting diode element 120. If the width of the trench 115 is too small, it is difficult to reduce the degree of warpage of the substrate 110. On the other hand, if the width of the trench 115 is too large (for example, larger than the width of the micro light-emitting diode element 120), the bonding layer 150 is not present at the position of the trench and cannot be bonded to the micro light-emitting diode element 120. The width of the trench 115 may be controlled within a specific range. Referring to FIG. 9D, the micro light-emitting diode element 120 has a element width W1, and each of the trenches 115 has a trench width W2. The trench width W2 is smaller than the element width W1. More specifically, in some embodiments, the trench width W2 is 5-50% of the element width W1. In other embodiments, the trench width W2 is 10-35% of the element width W1, and each of the micro light-emitting diode elements 120 corresponds to a plurality of trenches 115.

If the pattern density of the trenches 115 (i.e., the number of trenches 115 per unit area) is higher, the effect of reducing the warpage of the substrate 110 is better. However, if the pattern density of the trenches 115 is too high, the adhesion of the bonding layer 150 to the light-emitting diode elements 120 is insufficient, which tends to cause the light-emitting diode elements 120 to fall off. If the pattern density of the trenches 115 is too low, it is difficult to reduce the degree of warpage of the substrate 110, and it is also difficult to reduce the pressure applied to the micro light-emitting diode elements 120. The density of the trenches 115 may be controlled within a specific range. For example, one or more trenches 115 overlap one of the micro light-emitting diode elements 120. In the present embodiment, there are two trenches 115 overlapping one of the micro light-emitting diode elements 120, as shown in FIG. 9D. In other embodiments, there are three trenches 115 overlapping one of the micro light-emitting diode elements 120. In other embodiments, there are four trenches 115 overlapping one of the micro light-emitting diode elements 120.

Figure 10A:
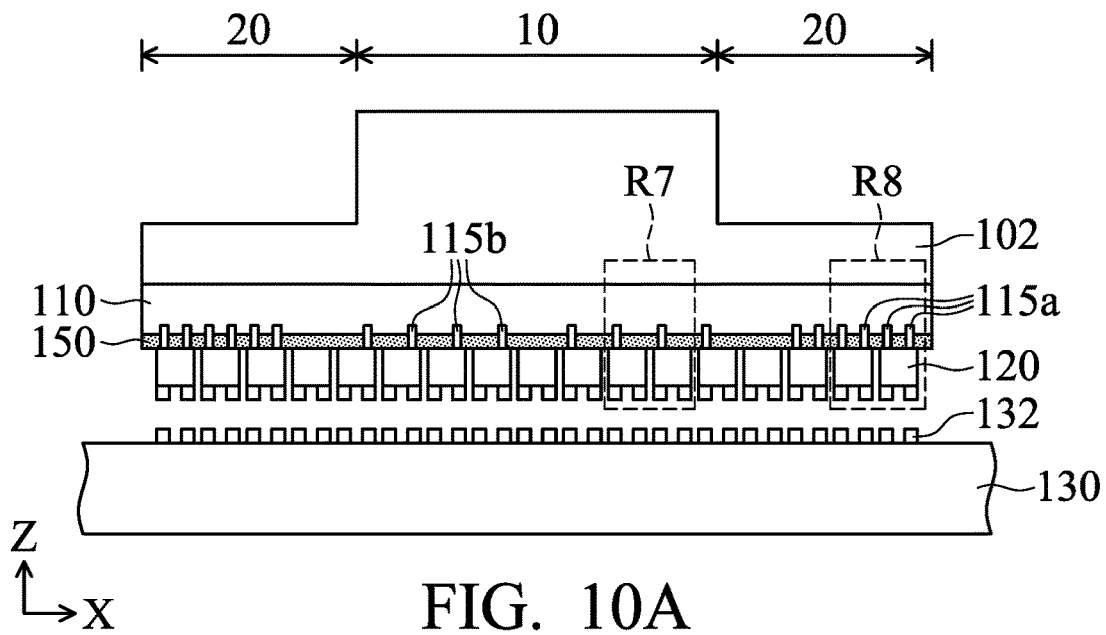
FIG. 10A is a cross-sectional view corresponding to a transferring process of the micro light-emitting diode elements, in accordance with other embodiments of the disclosure.
Figure 10B:
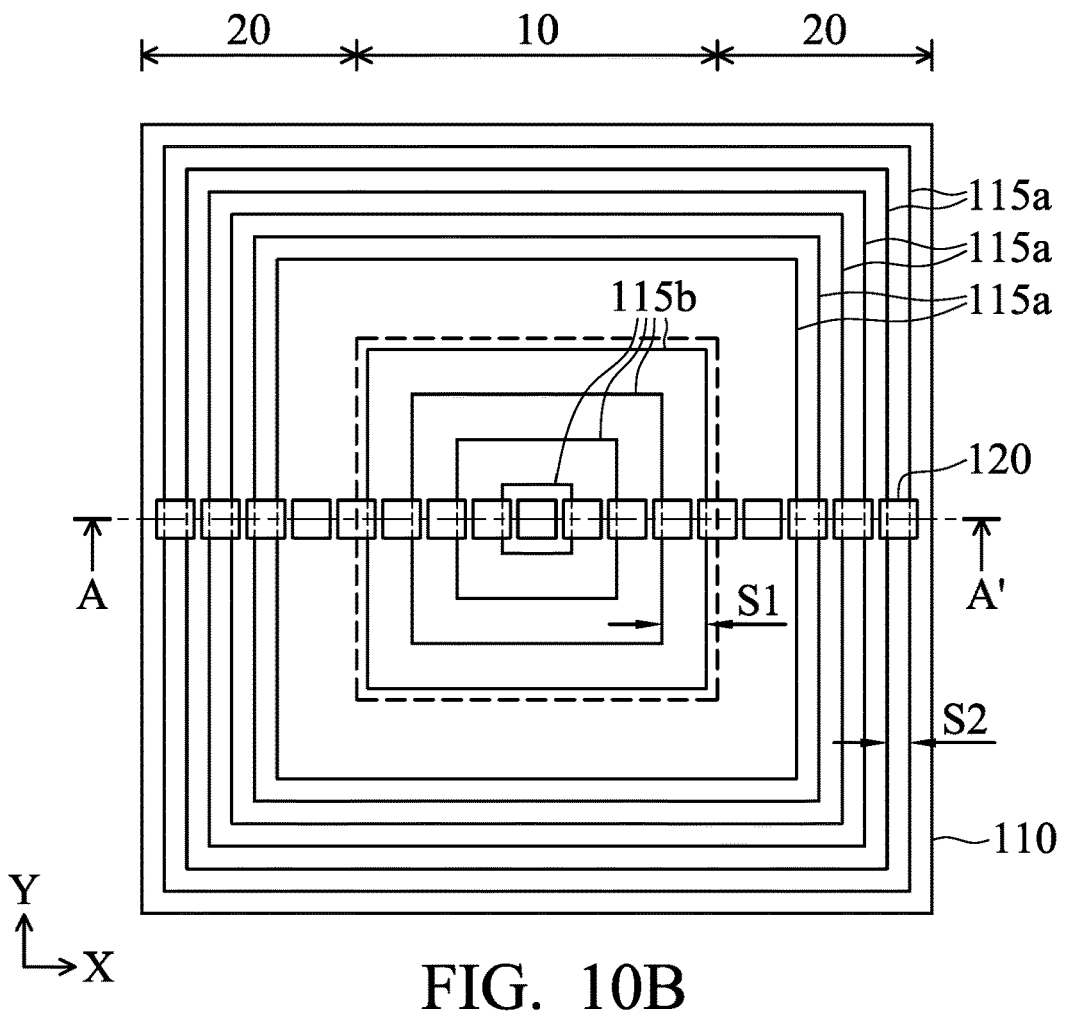
FIG. 10B is a bottom view of the micro light-emitting diode carrier board of FIG. 10A.
Figure 10C:
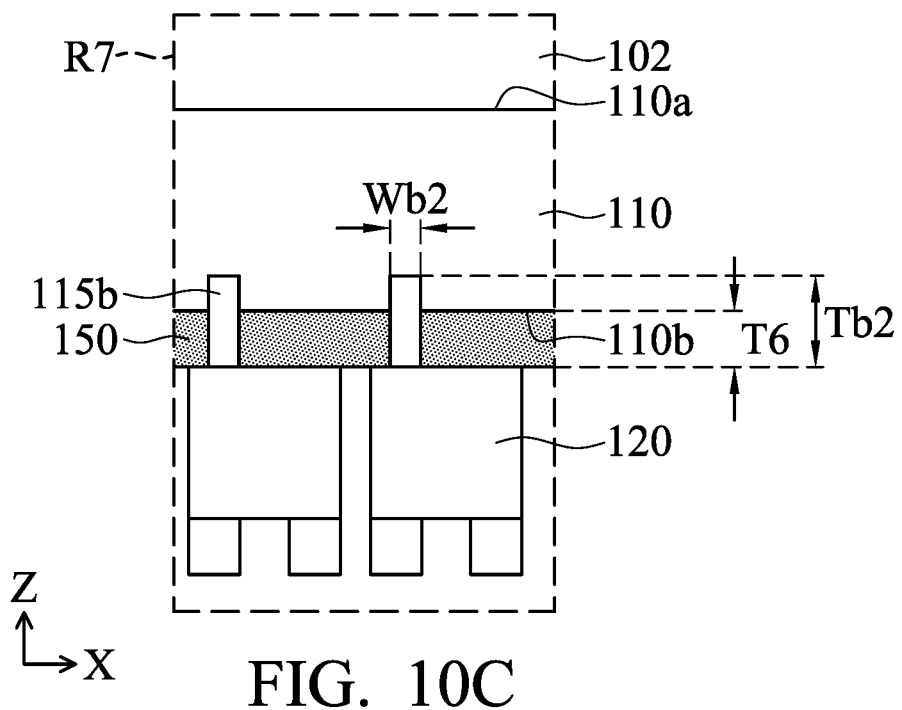
FIG. 10C is an enlarged cross-sectional view of the region R7 in FIG. 10A.
Figure 10D:
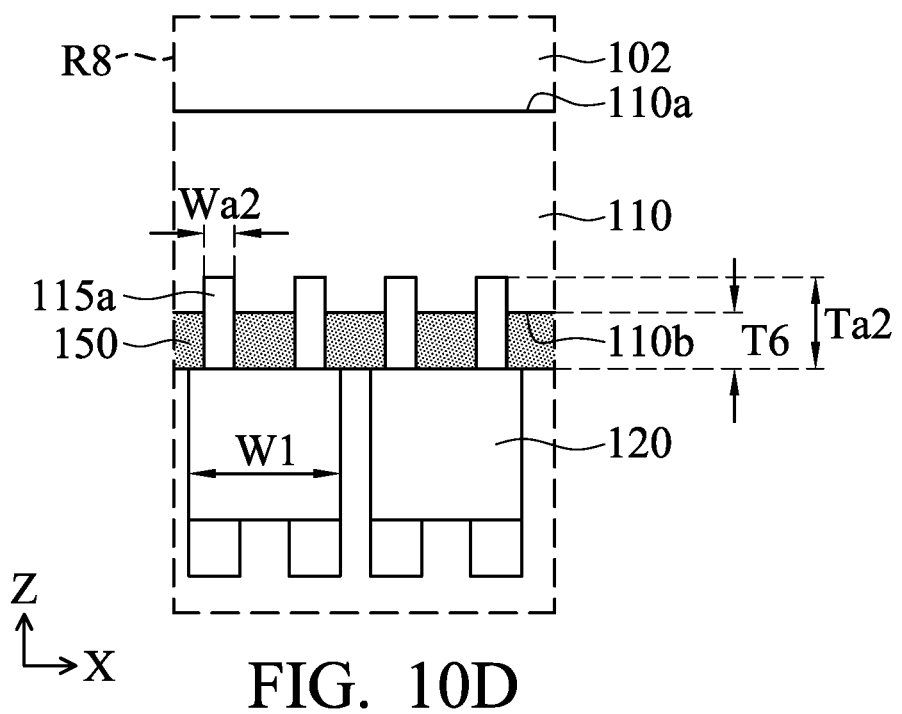
FIG. 10D is an enlarged cross-sectional view of the region R8 in FIG. 10A.

FIG. 10A is a cross-sectional view corresponding to a transferring process of the micro light-emitting diode elements, in accordance with other embodiments of the disclosure. FIG. 10B is a bottom view of the micro light-emitting diode carrier board of FIG. 10A, and FIG. 10A is a cross-sectional view taken along line A-A' of FIG. 10B. FIG. 10C is an enlarged cross-sectional view of the region R7 in FIG. 10A. FIG. 10D is an enlarged cross-sectional view of the region R8 in FIG. 10A. FIG. 10A to FIG. 10D are similar to FIG. 3A to FIG. 3D, respectively. In FIG. 10A to FIG. 10D, the elements that are the same as those shown in FIG. 3A to FIG. 3D are denoted by the same reference numerals. In order to simplify the description, the elements similar to those shown in FIG. 3A to FIG. 3D and the steps of forming the same are not described in detail herein.

The micro light-emitting diode carrier board shown in FIG. 10A is similar to the micro light-emitting diode carrier board shown in FIG. 3A, and the difference is the positions of the first trenches 115a and the second trenches 115b shown in FIG. 10A. Referring to FIG. 10A to FIG. 10D, the patterned structure is formed on the second surface 110b of the substrate 110, and the patterned structure includes a plurality of first trenches 115a and a plurality of second trenches 115b. The first trench 115a and the second trench 115b are both annular and arranged in a concentric shape when they are viewed from the Z-axis direction. In the present embodiment, the substrate 110 is rectangular, and the plurality of trenches 115 are concentric rectangular rings, as shown in FIG. 10B. The first trench 115a is formed in the peripheral region 20, and the second trench 115b is formed in the central region 10. In the central region 10, two adjacent second trenches 115b are spaced apart by a first space S1. In the peripheral region 20, two adjacent first trenches 115a are spaced apart by a second space S2. The second space S2 is smaller than the first space S1. In other words, in the present embodiment, the patterned structure has a first pattern density in the central region 10, and has a second pattern density in the peripheral region 20. The first pattern density is smaller than the second pattern density.

In the present embodiment, the first trench 115a and the second trench 115b are respectively formed on the peripheral region 20 of the substrate 110 and the central region 10. As described above, the degree of warpage of the substrate 110 can be reduced, and the damage or destruction of the micro light-emitting diode element 120 can be reduced or avoided. As a result, the reliability, yield, and durability of the micro light-emitting diode structure can be significantly improved. Furthermore, in the present embodiment, the pattern density of the patterned structure may be adjusted according to the degree of warpage. Therefore, the reliability, yield, and durability of the micro light-emitting diode structure can be further improved. The ratio S2/S1 of the second space S2 to the first space Si may be controlled within a specific range. In some embodiments, the ratio S2/S1 of the second space S2 to the first space S1 is 0.1-0.8. In other embodiments, the ratio S2/S1 of the second space S2 to the first space S1 is 0.2-0.6. In still other embodiments, the ratio S2/S1 of the second space S2 to the first space S1 is 0.3-0.4.

Furthermore, the depth Ta2 of the first trench 115a and the depth Tb2 of the second trench 115b may be identical to each other or different from each other. In some embodiments, the depth Ta2 of the first trench 115a and the depth Tb2 of the second trench 115b may be independently greater than the thickness T6 of the bonding layer 150. The width Wa2 of the first trench 115a and the width Wb2 of the second trench 115b may be identical to each other or different from each other. In some embodiments, the width Wa2 of the first trench 115a and the width Wb2 of the second trench 115b may independently be in the range of the trench width W2 described above.

Figure 11:
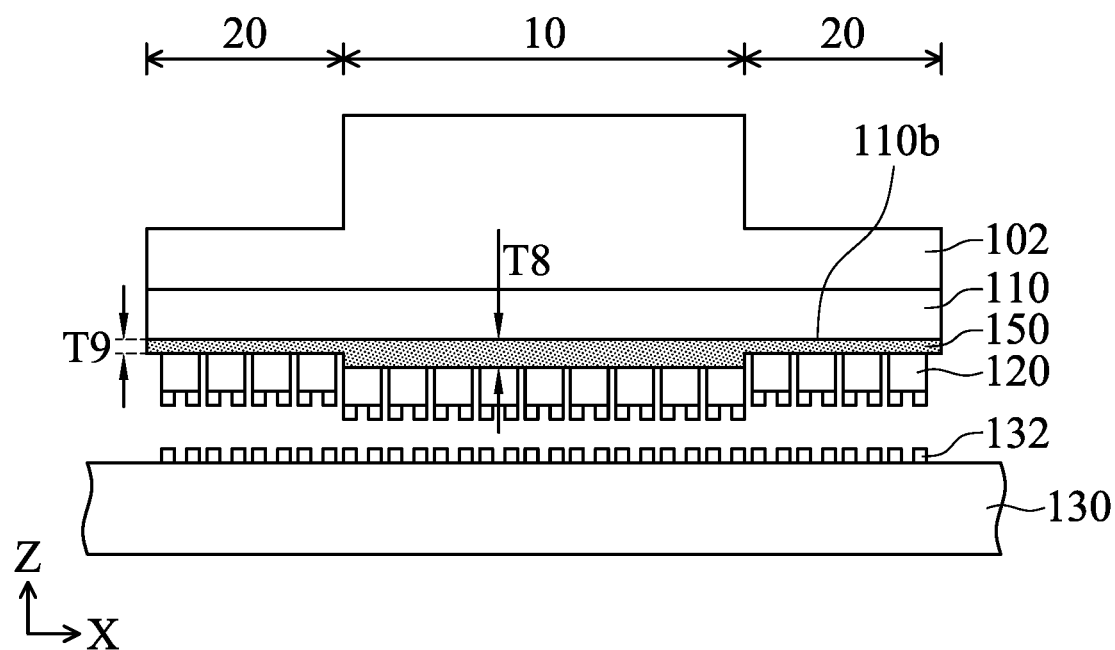
FIG. 11 is a cross-sectional view corresponding to a transferring process of the micro light-emitting diode elements, in accordance with other embodiments of the disclosure.

FIG. 11 is a cross-sectional view corresponding to a transferring process of the micro light-emitting diode elements, in accordance with other embodiments of the disclosure. FIG. 11 is similar to FIG. 1A. In FIG. 11, the elements that are the same as those in shown in FIG. 1A are denoted by the same reference numerals. In order to simplify the description, the elements similar to those shown in FIG. 1A and the steps of forming the same are not described in detail herein.

Referring to FIG. 11, in the present embodiment, the micro light-emitting diode carrier board includes a substrate structure having a central region 10 and a peripheral region 20. The substrate structure includes a substrate 110 and a bonding layer 150 formed on a lower surface of the substrate 110. The micro light-emitting diode carrier board includes a plurality of micro light-emitting diode elements 120 disposed on the bonding layer 150 and forming an array. The bonding layer 150 has a first thickness T8 in the central region 10 and has a second thickness T9 in the peripheral region 20. The first thickness T8 is different from the second thickness T9. In the present embodiment, the first thickness T8 is greater than the second thickness T9. In other words, the bonding layer 150 is a patterned bonding layer. The bonding layer 150 may be formed fully over the lower surface of the substrate 110, and then the bonding layer 150 of the peripheral region 20 is partially removed, thereby forming the patterned bonding layer 150 as shown in FIG. 11. In other embodiments, the bonding layer 150 may be formed fully over the second surface 110b, and then the bonding layer 150 is formed partially only in the central region 10, thereby forming the patterned bonding layer 150 as shown in FIG. 11. In the present embodiment, the bonding layer 150 is a patterned structure formed on the lower surface of the substrate 110.

As described above, if the thermal expansion coefficient of the bonding layer 150 is different from the thermal expansion coefficient of the substrate 110, the substrate 110 may be warped or bended. In the present embodiment, the thickness of the patterned bonding layer 150 in the central region 10 is greater than the thickness of the patterned bonding layer 150 in the peripheral region 20. When the micro light-emitting diode elements 120 located in the central region 10 are in contact with the receiving substrate 130, the thermal energy is conducted into the substrate 110 and causes the peripheral region 20 of the substrate 110 to warp toward the receiving substrate 130. When this warpage occurs in the substrate 110, the micro light-emitting diode element 120 located in the peripheral region 20 moves downward and is in contact with the receiving substrate 130. In the present embodiment, the transfer holder 102 can secure the substrate 110 at this particular position without applying additional pressure to the substrate 110. In other words, in the present embodiment, all of the micro light-emitting diode elements 120 can be bonded to the receiving substrate 130 by the warpage of the patterned bonding layer 150 and the substrate 110. As a result, the micro light-emitting diode element 120 can be prevented from being damaged by the pressure, thereby further improving the reliability, yield and durability of the micro light-emitting diode structure.

In order to make the micro light-emitting diode element 120 located in the peripheral region 20 to be in contact with the receiving substrate 130, the ratio T8/T9 of the first thickness T8 to the second thickness T9 may be controlled within a specific range. In some embodiments, the ratio T8/T9 of the first thickness T8 to the second thickness T9 is 1.1-3.0. In other embodiments, the ratio T8/T9 of the first thickness T8 to the second thickness T9 is 1.3-2.0.

It should be understood that the shapes of the substrate 110 shown in FIG. 1B and FIG. 5 are for illustrative purposes only and are not intended to limit the present invention. For example, when the substrate 110 is viewed from the Z-axis direction, the substrate 110 may be a triangle, a parallelogram, a regular polygon, an irregular polygon, an ellipse, or other suitable shapes. Furthermore, the number of trenches and their arrangement are also for illustrative purposes only and are not intended to limit the invention. In addition, the shape of the bonding layer 150 shown in FIG. 11 is also for illustrative purposes only and is not intended to limit the present invention. For example, the cross-sectional profile of the bonding layer 150 may also be a triangular or a trapezoidal shape that tapers from the central region 10 toward the peripheral region 20. Those skilled in the art to which the present invention pertains may modify or combine the technical concepts disclosed in the embodiments of the present specification. For example, in FIG. 1B, the substrate 110 may be a circular shape, and the plurality of trenches 115 are concentric circular rings. For example, the trenches 115X of FIG. 4 or the trenches 115Y of FIG. 5 may be formed on the second surface (i.e., the lower surface) of the substrate.

As mentioned above, in the micro light-emitting diode carrier board provided by the embodiments, a patterned structure is formed on the first surface or the second surface of the substrate structure, thereby reducing or avoiding the warpage or bending of the substrate structure, or the micro light-emitting diode element can be reduced or prevented from being damaged during the transferring process. As a result, the reliability, yield and durability of the micro light-emitting diode structure can be significantly improved.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A micro light-emitting diode carrier board, comprising:
a substrate structure having a first surface and a second surface and having a central region and a peripheral region located outside the central region;
a plurality of micro light-emitting diode elements forming an array and located on the second surface of the substrate structure; and
a patterned structure formed on the first surface or the second surface, wherein the plurality of micro light-emitting diode elements is overlapped and disposed on the patterned structure, the patterned structure has a first pattern density in the central region and has a second pattern density in the peripheral region, and the first pattern density is different from the second pattern density.

2. The micro light-emitting diode carrier board as claimed in claim 1, wherein when a straight line sequentially passes through a center point of the central region, an edge of the central region, the peripheral region, and an edge of the substrate structure, there is a first linear distance from the center point of the central region to the edge of the substrate structure, there is a second linear distance from the center point to the edge of the central region, and the second linear distance is not more than 0.8 times the distance of the first linear distance.

3. The micro light-emitting diode carrier board as claimed in claim 2, wherein the patterned structure comprises:
a plurality of trenches formed on the first surface of the substrate structure, wherein the trenches are formed only in the peripheral region.

4. The micro light-emitting diode carrier board as claimed in claim 3, wherein the plurality of trenches extend from the edge of the substrate structure toward the central region and are spaced apart from each other.

5. The micro light-emitting diode carrier board as claimed in claim 1, wherein the patterned structure comprises:
a plurality of trenches formed on the first surface of the substrate structure, wherein the plurality of trenches are annular and arranged in a concentric shape.

6. The micro light-emitting diode carrier board as claimed in claim 5, wherein two adjacent trenches are spaced apart by a first space in the central region, wherein two adjacent trenches are spaced apart by a second space in the peripheral region, and wherein the second space is smaller than the first space.

7. The micro light-emitting diode carrier board as claimed in claim 5, wherein the plurality of trenches are formed only in the peripheral region.

8. The micro light-emitting diode carrier board as claimed in claim 5, wherein the substrate structure has a thickness, wherein each of the trenches has a trench depth, and wherein the trench depth is 10-70% of the thickness.

9. The micro light-emitting diode carrier board as claimed in claim 5, wherein each of the micro light-emitting diode elements has an element width, wherein each of the trenches has a trench width, and wherein the trench width is less than the element width.

10. The micro light-emitting diode carrier board as claimed in claim 5, wherein one or more trenches overlap one micro light-emitting diode element.

11. The micro light-emitting diode carrier board as claimed in claim 2, wherein the patterned structure comprises:
a buffering material formed on the first surface of the substrate structure and located in the peripheral region, wherein the buffering material surrounds the central region.

12. The micro light-emitting diode carrier board as claimed in claim 2, wherein the patterned structure comprises:
a protruding portion formed on the first surface of the substrate structure and located in the central region.

13. The micro light-emitting diode carrier board as claimed in claim 12, wherein the protruding portion is integrated with the substrate structure.

14. The micro light-emitting diode carrier board as claimed in claim 12, wherein the patterned structure is a patterned film adhering on the first surface of the substrate structure.

15. The micro light-emitting diode carrier board as claimed in claim 1, wherein the patterned structure comprises:
a plurality of trenches formed on the second surface of the substrate structure, wherein a density of the trenches is reduced from the peripheral region toward the central region.

16. The micro light-emitting diode carrier board as claimed in claim 15, wherein the plurality of trenches are arranged only in the peripheral region.

17. A micro light-emitting diode carrier board, comprising:
a plurality of micro light-emitting diode elements; and
a substrate structure having a central region and a peripheral region, wherein the substrate structure comprises:
a substrate having an upper surface and a lower surface; and
a bonding layer formed on the lower surface and having a first thickness in the central region, wherein the bonding layer has a second thickness in the peripheral region, and the first thickness is greater than the second thickness and a ratio of the first thickness to the second thickness is 1.1-3.0;
wherein the micro light-emitting diode elements are disposed on the bonding layer and form an array.

* * * * *